United States Patent
Kozawa et al.

(10) Patent No.: US 8,349,542 B2
(45) Date of Patent: *Jan. 8, 2013

(54) MANUFACTURING PROCESS OF SEMICONDUCTOR DEVICE

(75) Inventors: Miwa Kozawa, Kawasaki (JP); Koji Nozaki, Kawasaki (JP); Takahisa Namiki, Kawasaki (JP); Junichi Kon, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/783,244

(22) Filed: May 19, 2010

(65) Prior Publication Data

US 2010/0227278 A1 Sep. 9, 2010

Related U.S. Application Data

(60) Division of application No. 11/643,896, filed on Dec. 22, 2006, now Pat. No. 7,744,768, which is a division of application No. 10/305,258, filed on Nov. 27, 2002, now Pat. No. 7,189,783, which is a continuation-in-part of application No. 10/103,554, filed on Mar. 22, 2002, now abandoned.

(30) Foreign Application Priority Data

| Nov. 27, 2001 | (JP) | 2001-361505 |
| May 14, 2002 | (JP) | 2002-139317 |
| Nov. 12, 2002 | (JP) | 2002-328931 |

(51) Int. Cl.
  *G03F 7/26* (2006.01)
(52) U.S. Cl. ...................................... 430/313
(58) Field of Classification Search .................. 430/313, 430/311
  See application file for complete search history.

(56) References Cited

U.S. PATENT DOCUMENTS 5,001,032 A * 3/1991 Katayama et al. ............ 430/203
(Continued)

FOREIGN PATENT DOCUMENTS

CN 1222756 A 7/1999
(Continued)

OTHER PUBLICATIONS

Database WPI; Section Ch, Week 198423; Derwent Publication Ltd. London, GB, Class A18, AN 1984-142833; XP002222915 & JP 59-073944 A (Bridgestone Tire KK), Apr. 26, 1984; *abstract*.

(Continued)

*Primary Examiner* — Brittany Raymond
(74) *Attorney, Agent, or Firm* — Westerman, Hattori, Daniels & Adrian, LLP

(57) ABSTRACT

A resist pattern thickening material has resin, a crosslinking agent and a compound having a cyclic structure, or resin having a cyclic structure at a part. A resist pattern has a surface layer on a resist pattern to be thickened with etching rate (nm/s) ratio of the resist pattern to be thickened the surface layer of 1.1 or more, under the same condition, or a surface layer to a resist pattern to be thickened. A process for forming a resist pattern includes applying the thickening material after forming a resist pattern to be thickened on its surface. A semiconductor device has a pattern formed by the resist pattern. A process for manufacturing the semiconductor device has applying, after forming a resist pattern to be thickened, the thickening material to the surface of the resist pattern to be thickened, and patterning the underlying layer by etching, the pattern as a mask.

4 Claims, 13 Drawing Sheets

U.S. PATENT DOCUMENTS

| | | | |
|---|---|---|---|
| 5,147,344 A | 9/1992 | Sachau et al. | |
| 5,173,393 A * | 12/1992 | Sezi et al. | 430/323 |
| 5,858,620 A | 1/1999 | Ishibashi et al. | |
| 6,146,806 A | 11/2000 | Maeda et al. | |
| 6,319,853 B1 * | 11/2001 | Ishibashi et al. | 438/780 |
| 6,420,085 B1 | 7/2002 | Nishi et al. | |
| 6,455,228 B1 | 9/2002 | Tachikawa et al. | |
| 6,579,657 B1 * | 6/2003 | Ishibashi et al. | 430/270.1 |
| 2001/0033990 A1 | 10/2001 | Hatakeyama et al. | |
| 2002/0016431 A1 * | 2/2002 | Iwasa et al. | 526/284 |
| 2002/0037476 A1 | 3/2002 | Kamijima | |
| 2002/0146645 A1 | 10/2002 | Tachikawa et al. | |

FOREIGN PATENT DOCUMENTS

| | | |
|---|---|---|
| DE | 19814142 A1 | 10/1998 |
| DE | 19843179 A1 | 7/1999 |
| DE | 19915899 A1 | 2/2000 |
| DE | 10014083 A1 | 3/2001 |
| EP | 1152036 A1 | 11/2001 |
| EP | 1223470 A1 | 7/2002 |
| JP | 5-197151 A | 8/1993 |
| JP | 10-73927 A | 3/1998 |
| JP | 11-149160 A | 6/1999 |
| JP | 2000-347414 A | 12/2000 |
| JP | 2001-228616 A | 8/2001 |
| JP | 2001-242636 A | 9/2001 |
| JP | 2002-6491 A | 1/2002 |
| JP | 2002-49161 A | 2/2002 |
| JP | 2002-060641 A | 2/2002 |
| KR | 2001-0050483 A | 6/2001 |
| KR | 2001-0099651 A | 11/2001 |

OTHER PUBLICATIONS

Database WPI; Section Ch, Week 198709; Derwent Publication Ltd. London, GB, Class A14, AN 1987-059912; XP002222917 & JP 62-013390 A (Kanzaki Paper Mfg Co. Ltd.), Jan. 22, 1987; *abstract*.

Database WPI; Section Ch, Week 199438; Derwent Publication Ltd. London, GB, Class A89, AN 1994-307445; XP002222934 & JP 06-234275 A (Oji Paper Co.), Aug. 23, 1994; *abstract*.

Chinese Office Action dated May 15, 2009, issued in corresponding Chinese Patent Application No. 2007-10005436.X.

Korean Office Action dated Mar. 22, 2007, issued in corresponding Korean Application No. 10-2002-0074280.

* cited by examiner

Applying of resist pattern thickening material / Prebaking crosslinking baking

Development with water

Resist pattern thickening

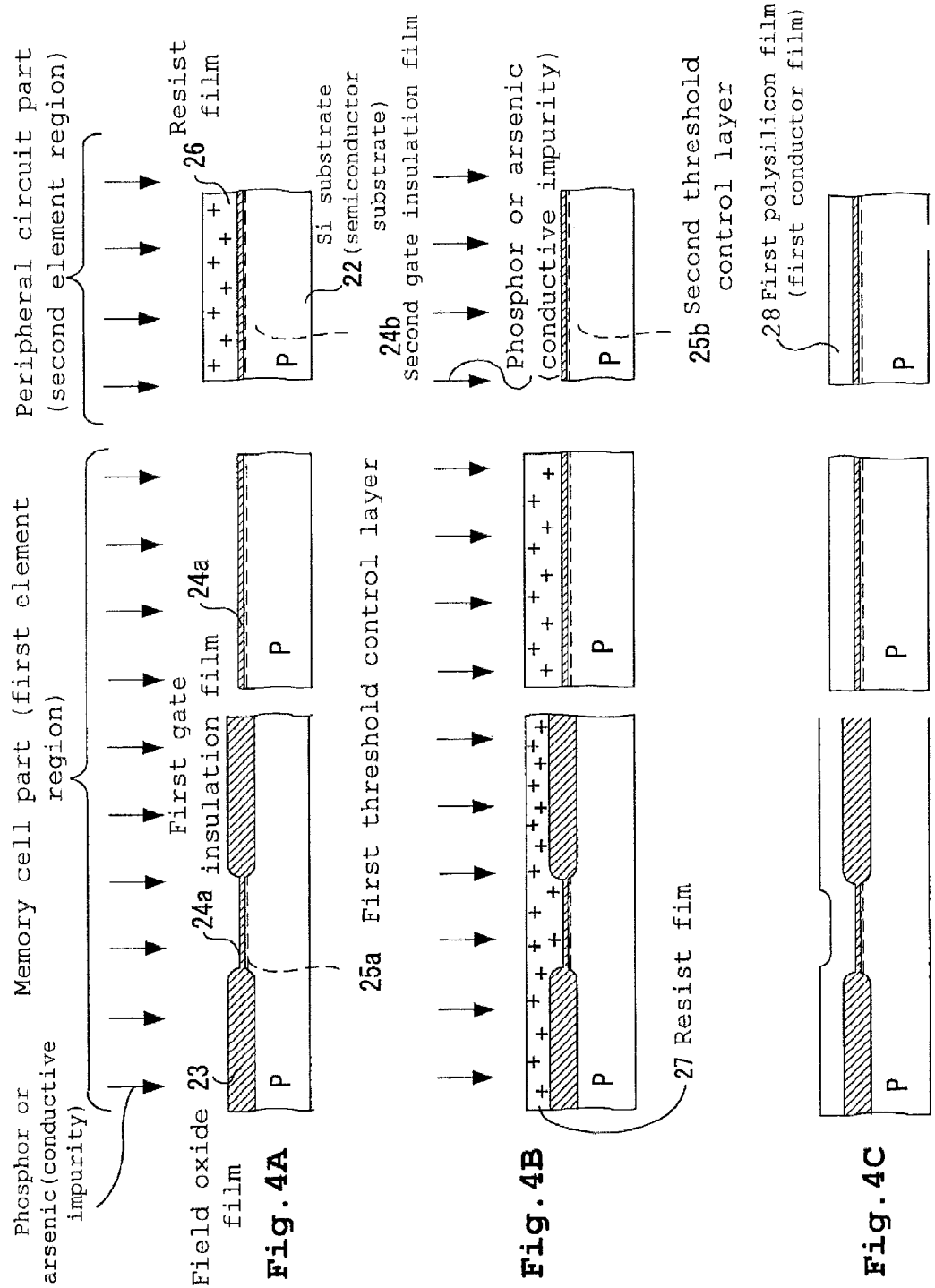

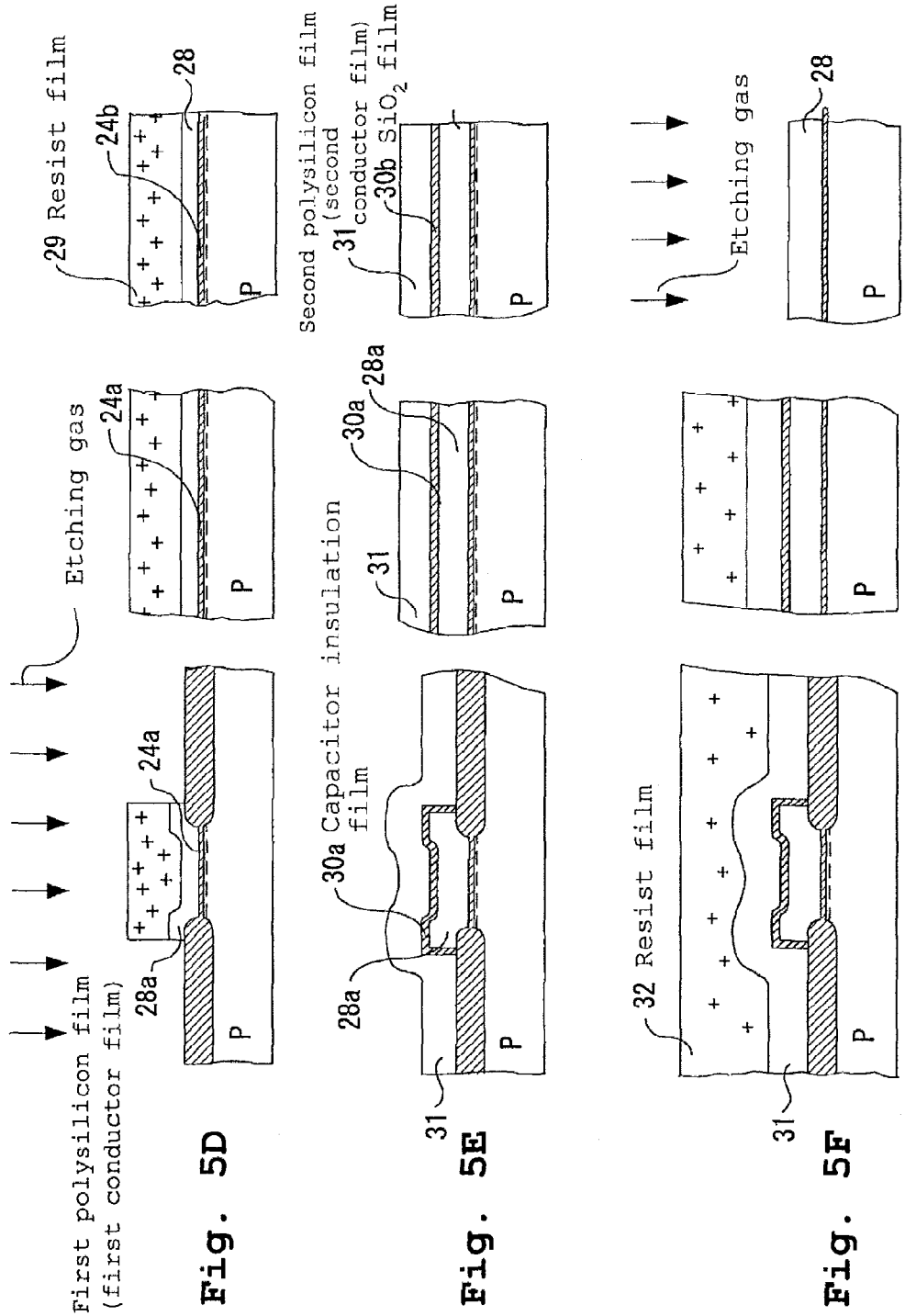

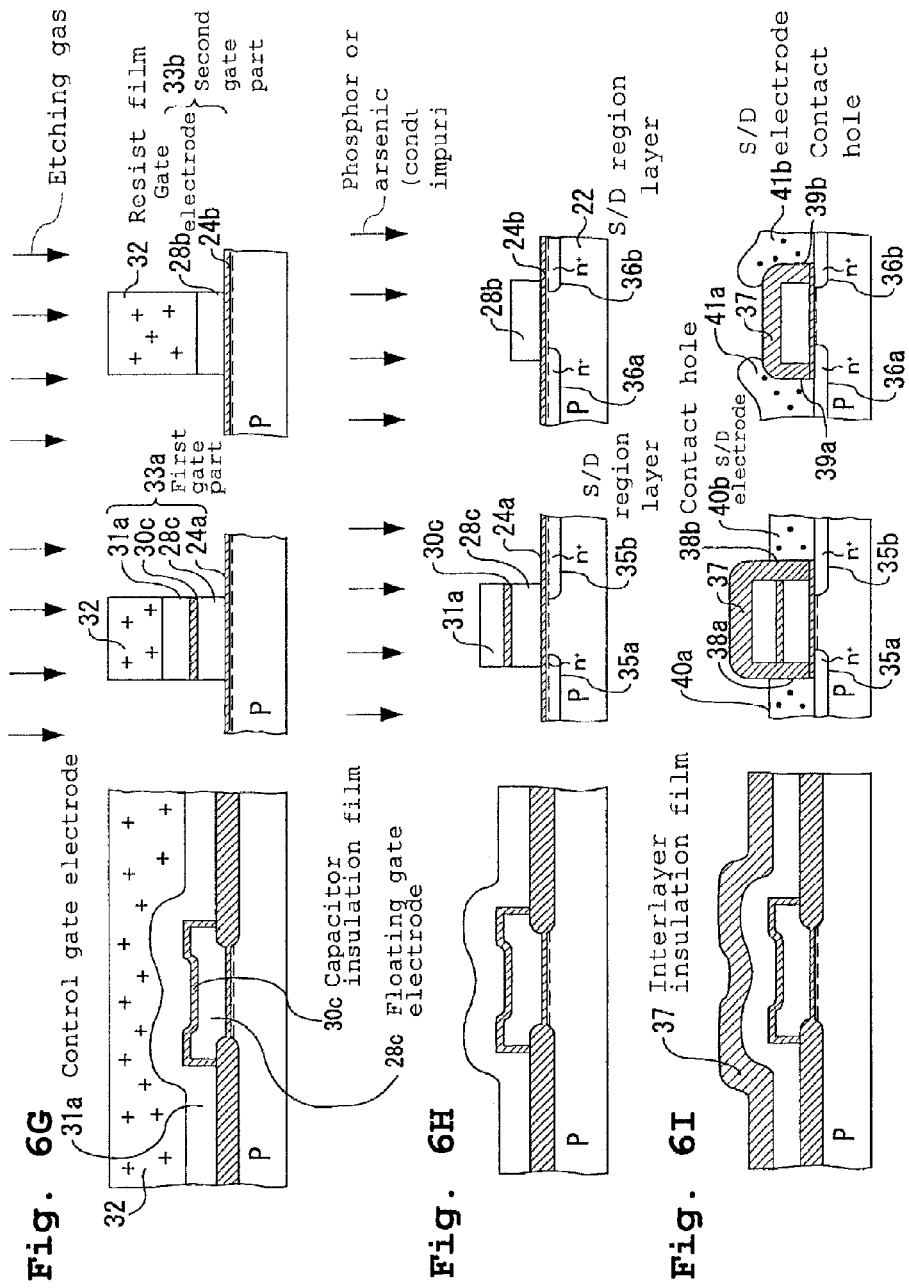

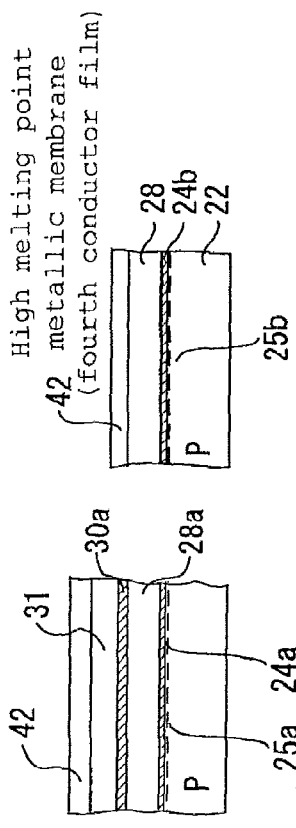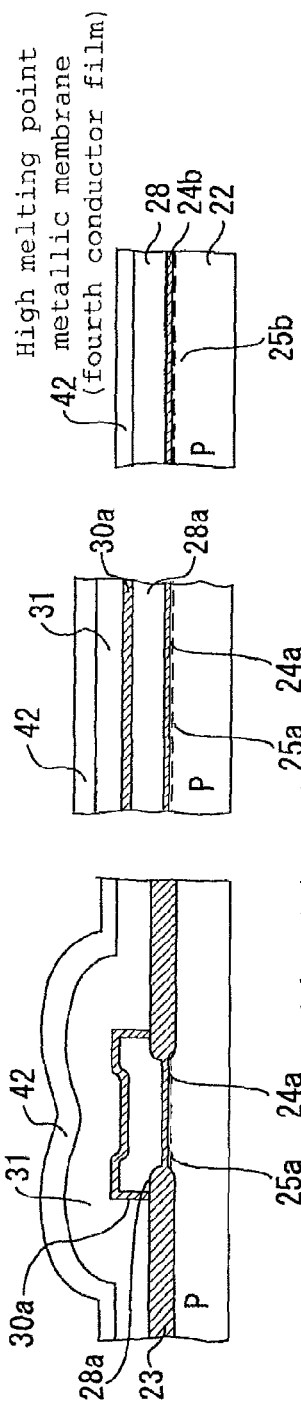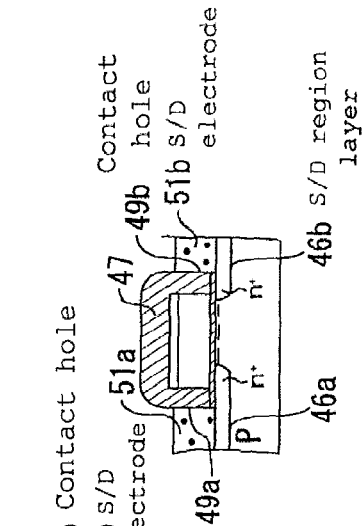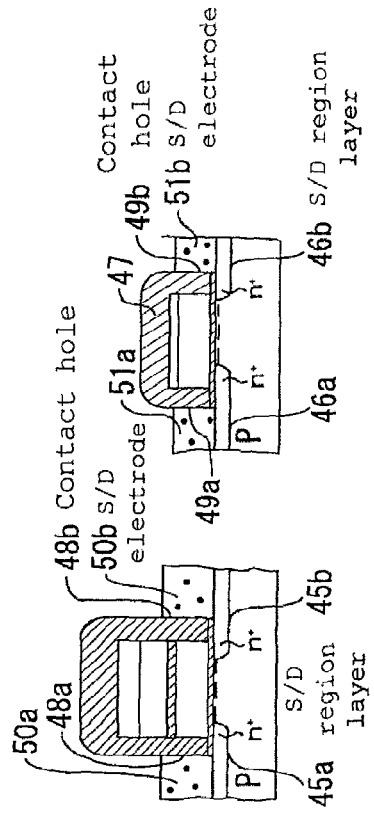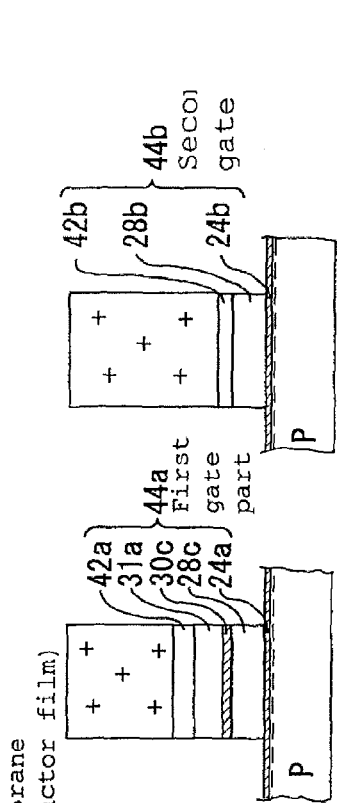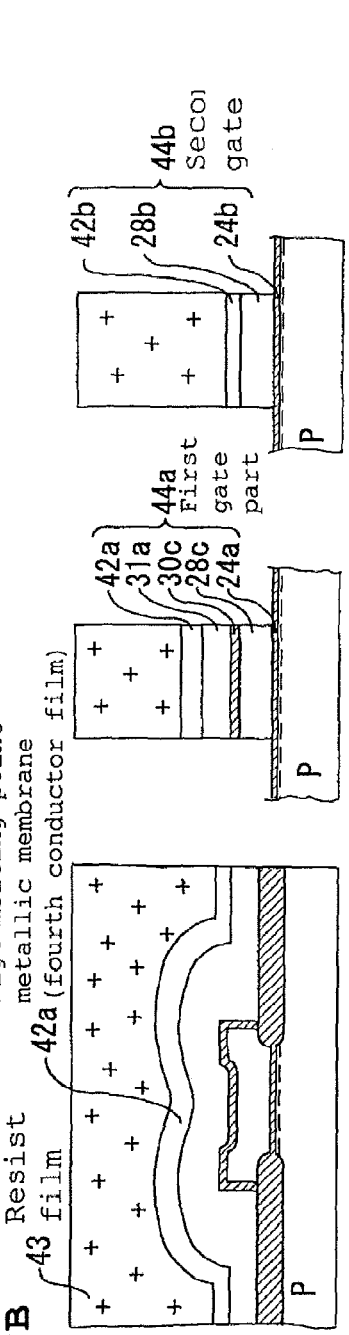
Fig. 7A
Fig. 7B
Fig. 7C

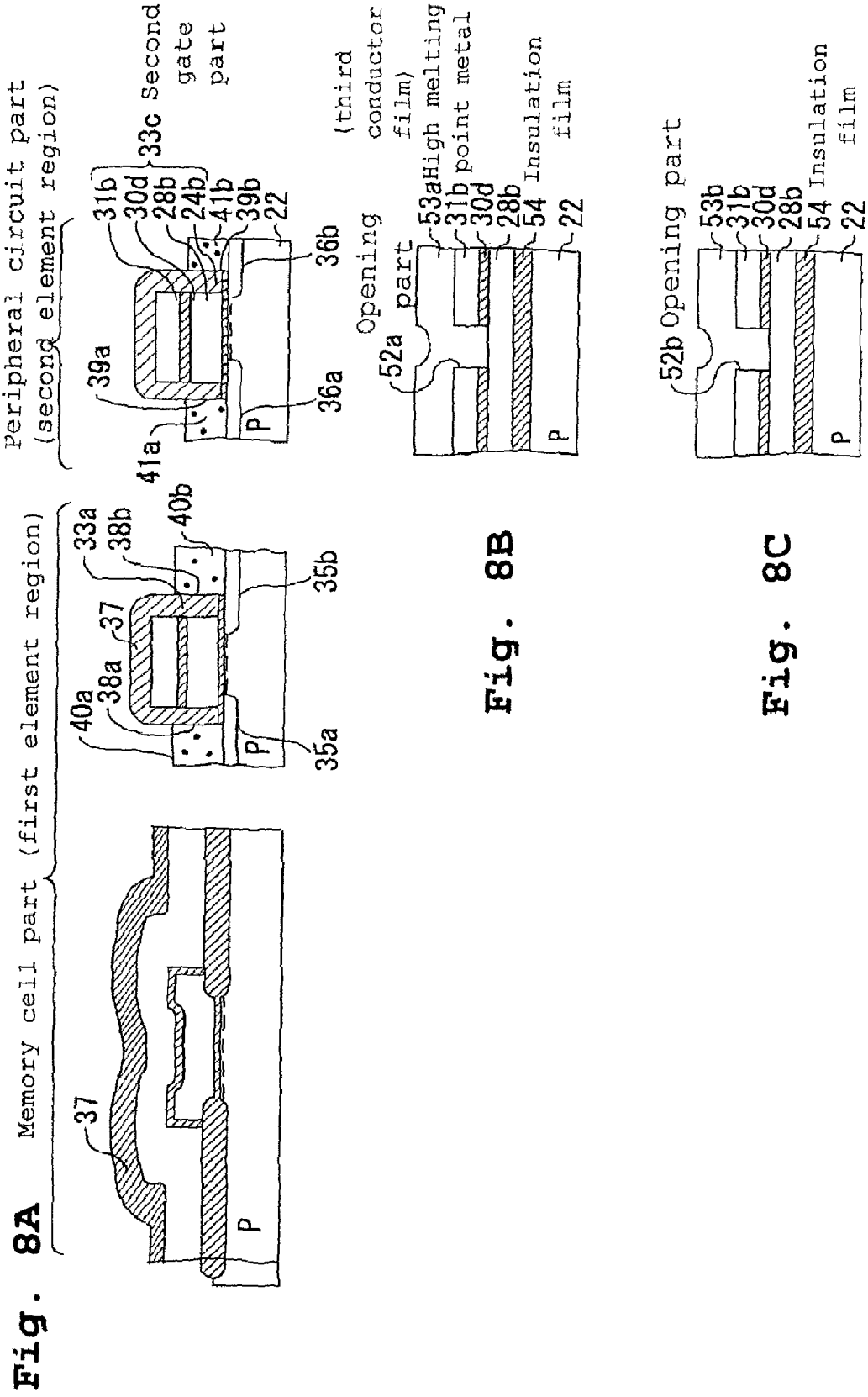

US 8,349,542 B2

MANUFACTURING PROCESS OF SEMICONDUCTOR DEVICE

This application is a division of U.S. application Ser. No. 11/643,896, filed Dec. 22, 2006, which is a division of U.S. Pat. No. 7,189,783, issued Mar. 13, 2007, which is a continuation-in-part of U.S. Ser. No. 10/103,554, filed Mar. 22, 2002, abandoned.

CROSS-REFERENCE TO RELATED APPLICATIONS

This application is based upon and claims the benefit of priority from the prior Japanese Patent Application No. 2001-361505, filed on Nov. 27, 2001, the prior Japanese Patent Application No. 2002-139317, filed on May 14, 2002 and the prior Japanese Patent Application No. 2002-328931, filed on Nov. 12, 2002, the entire contents of which are incorporated herein by reference.

BACKGROUND OF THE INVENTION

1. Field of the Invention

The present invention relates to a resist pattern thickening material which thickens a resist pattern by being applied onto a resist pattern that is formed of an ArF resist, may form a fine pattern exceeding exposure limit of optical source of an exposure device, and allows for improving etching resistance of the resist pattern; a resist pattern which may be patterned by an ArF excimer laser and the like, has a fine structure, and is excellent in etching resistance; and an efficient process for forming the resist pattern; a semiconductor device having a fine pattern formed by the resist pattern, and an efficient process for manufacturing the semiconductor device.

2. Description of the Related Art

Recently, a semiconductor integrated circuit is highly integrated. LSI and VLSI have been utilized. Accordingly, a wiring pattern now reaches the range of less than 0.2 µm, and the minimum pattern is 0.1 µm or less. In order to form a fine wiring pattern, it is very important to take advantage of lithography, which refers to the steps to cover a treating substrate formed of thin films by a resist film, to form a resist pattern by developing after selectively exposing light, and to carry out dry-etching by using the resist pattern as a mask. Thereafter, it is also very important to obtain a desired pattern by removing the resist pattern.

In order to form a fine wiring pattern, it is necessary both to shorten a wavelength of optical source of an exposure device, and to develop a resist material which has a high resolution based upon properties of an optical source. However, in order to shorten the wavelength of the optical source at the exposure device, it is indispensable to renew an exposure device, which results in considerable expenses. Developing a resist material which suits an exposure with a shorter wavelength is not very easy.

A process of manufacturing a semiconductor device includes first forming a fine pattern by resist pattern, and then finely using the resist pattern as a mask. Therefore, the resist pattern is preferably excellent in etching resistance. However, the newest technique, an ArF (argon fluoride) excimer laser exposure, has a problem that a resist pattern used for the exposure is insufficient in etching resistance. It is possible to use a KrF (krypton fluoride) resist, but the KrF resist sometimes has insufficient etching resistance in a case of a severe etching condition, a thick treating layer, forming a fine pattern, and having a thin resist thickness. There has been a request for a technique to form a resist pattern excellent in etching resistance, and to form a fine pattern by using the resist pattern.

A technique called RELACS is described in Japanese Patent Application Laid-Open No. 10-73927, in which a fine pattern can be formed by use of KrF (krypton fluoride) excimer laser (wavelength: 248 nm) of deep ultraviolet beam as the exposure light for a resist. This technique comprises forming a resist pattern by exposing the resist (positive type or negative type) with the KrF (krypton fluoride) excimer laser (wavelength: 248 nm) as the exposure light, providing a film by use of a water-soluble resin composition so as to cover the resist pattern, making the film interact with the resist pattern in the interface by use of the residual acid in the material of the resist pattern to thicken (hereinafter often referred also to as "swell") the resist pattern, thereby shortening the pitch between resist patterns to form the fine pattern.

In that case, however, the KrF (krypton fluoride) resist is an aromatic resin composition such as novolac resin, naphtoquinodiadido, and the like. Since an aromatic ring contained in the aromatic resin composition absorbs the ArF excimer laser light, the ArF (argon fluoride) excimer laser light is unable to transmit the KrF resist. Therefore, the ArF (argon fluoride) excimer laser light, which has a shorter wavelength than the KrF excimer laser light, cannot be used as the exposure light.

From the viewpoint of forming a fine wiring pattern, it is preferable that the ArF (argon fluoride) excimer laser light can also be used.

Accordingly, a technique to form a fine pattern excellent in etching resistance with low cost, by using the ArF (argon fluoride) excimer laser light as an optical source of an exposure device when patterning is not yet provided.

SUMMARY OF THE INVENTION

An object of the present invention is to provide a resist pattern thickening material capable of forming a fine pattern with low cost by applying the resist pattern thickening material, exceeding an exposure limit for an optical resource of an exposure device, improving the etching resistance of the resist pattern.

The present invention has a further object to provide a resist pattern which can be patterned by using ArF excimer laser, has a fine structure, and is excellent in etching resistance.

Another object of the present invention is to provide a process for forming a resist pattern capable of using ArF excimer laser light as exposure light with excellent mass-productivity and forming a fine pattern by the resist pattern over the exposure limit of light with low cost, with ease, and with improving etching resistance.

The present invention has an additional object to provide a high-performance semiconductor device having a fine pattern formed by a resist pattern.

The present invention has another object to provide a process for manufacturing a semiconductor device capable of using ArF excimer laser, an exposure light, and efficiently mass-producing a high-performance semiconductor device having a fine pattern by a resist pattern finely formed thereon exceeding the exposure limit of light.

The resist pattern thickening material of the present invention comprises a resin, a crosslinking agent and a compound having a cyclic structure, or it comprises a resin which has a cyclic structure at a part and a crosslinking agent.

When the resist pattern thickening material is applied onto a resist pattern, among the applied resist pattern thickening material, a portion thereof present near the interface with the resist pattern is penetrated into the resist pattern and then crosslinked with (mixed with) the material of the resist pattern. The resist pattern thickening material shows good affinity toward the resist pattern. Therefore, a surface layer (a mixing layer), where the resist pattern thickening material is integrated (mixed) into the resist pattern, is efficiently formed on a surface of the resist pattern (the resist pattern is efficiently thickened by the resist pattern thickening material).

Since the surface layer is formed of the resist pattern thickening material and contains the compound having a cyclic structure or a resin which has a cyclic structure at least at a part, the surface layer in the resist pattern is excellent in etching resistance. As a result of that the resist pattern formed (hereinafter, referred to as a "resist pattern") is already thickened by the resist pattern thickening material, the pattern formed by the resist pattern has a finer structure, exceeding an exposure limit.

The resist pattern of the present invention comprises a surface layer on a resist pattern to be thickened, with a ratio of 1.1 or more (resist pattern to be thickened to surface layer) in etching rate (nm/s) of the surface layer to the resist pattern under the same condition. The resist pattern can be formed by using an ArF excimer laser for an exposure light. Since this resist pattern has the highly etching-resistant surface layer, it is suitable for etching process, and for forming of a fine pattern.

The process for forming a resist pattern of the present invention comprises a step for applying the resist pattern thickening material of the present invention so as to cover a surface of a resist pattern to be thickened after a step of formation of the resist pattern to be thickened. When the resist pattern thickening material is applied onto a resist pattern to be thickened, in the coated resist pattern thickening material, a portion thereof present near the interface with the resist pattern is penetrated into the resist pattern to be thickened and then crosslinked with (mixed with) the material of the resist pattern. Therefore, the resist pattern thickening material is integrated into the resist pattern to be thickened (a mixing layer is formed). The surface layer is formed of the resist pattern thickening material, and comprises a compound having a cyclic structure or a resin which has a cyclic structure at least at a part, hence the surface layer is excellent in etching resistance. The resist pattern thus formed is already thickened by the resist pattern thickening material. Therefore, a pattern formed by the resist pattern has a finer structure, exceeding an exposure limit.

The semiconductor device of the present invention comprises a pattern formed by the resist pattern of the present invention.

This semiconductor device has a high quality and high performance since it has a fine pattern formed by this resist pattern.

The process for manufacturing a semiconductor device of the present invention comprises a step for forming a resist pattern by applying the resist pattern thickening material of the present invention to cover a surface of a resist pattern to be thickened to thicken the resist pattern to be thickened to form the resist pattern, after forming the resist pattern to be thickened on an underlying layer, and a step for patterning the underlying layer by performing an etching using the resist pattern formed in the step for forming the resist pattern as a mask.

In this process for manufacturing a semiconductor device, the resist pattern thickening material is applied onto the resist pattern to be thickened after the resist pattern to be thickened is formed on the underlying layer. The resist pattern thickening material present near the interface with the resist pattern to be thickened is penetrated into the resist pattern to be thickened and then crosslinked with the material of the resist pattern. Therefore, a surface layer integrated with the resist pattern to be thickened is formed on the resist pattern to be thickened. Since the surface layer (mixing layer) is formed of the resist pattern thickening material and contains the compound having a cyclic structure and the resin which has a cyclic structure at least at a part, the surface layer in the resulting resist pattern is excellent in etching resistance, and the etching processing or the like can be suitably performed. Since the resulting resist pattern is thickened by the resist pattern thickening material, the pitch of the pattern by the resist pattern is smaller (finer) than the pitch formed by the resist pattern prior to thickening, to the extent of the thickened portion by the resist pattern thickening material. The finer pattern by the resist pattern is formed exceeding the exposure limit of light.

By etching over the mask of the resist pattern which has excellent etching resistance, the resist to be thickened is finely patterned.

As a result, a semiconductor device having an extremely fine pattern can be efficiently manufactured.

BRIEF DESCRIPTION OF THE DRAWINGS

FIGS. 4A through 4C are schematic sectional views (1) for showing a manufacturing process for FLASH EPROM that is one example of a process for manufacturing a semiconductor device according to the present invention.

FIGS. 5D through 5F are schematic sectional views (2) for showing a manufacturing process for FLASH EPROM that is one example of a process for manufacturing a semiconductor device according to the present invention.

FIGS. 6G through 6I are schematic sectional views (3) for showing a manufacturing process for FLASH EPROM that is one example of a process for manufacturing a semiconductor device according to the present invention.

FIGS. 7A through 7C are schematic sectional views for showing a manufacturing process for FLASH EPROM that is another embodiment of the process for manufacturing a semiconductor device according to the present invention.

FIGS. 8A through 8C are schematic sectional views for showing a manufacturing process for FLASH EPROM that is another embodiment of the process for manufacturing a semiconductor device according to the present invention.

DESCRIPTION OF THE PREFERRED EMBODIMENTS

Resist Pattern Thickening Material

Figure 1A:
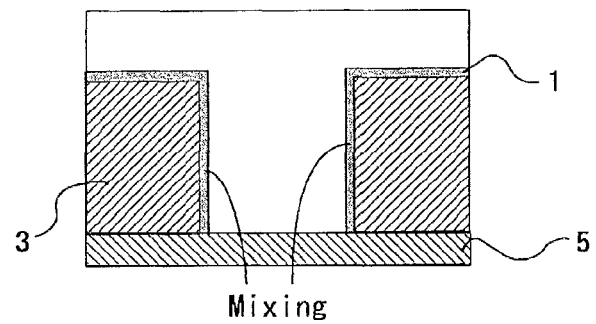
FIGS. 1A through 1C is a schematic view for showing a mechanism of thickening of a resist pattern by use of a resist pattern thickening material according to the present invention.

The resist pattern thickening material of the present invention is a water-soluble or an alkali-soluble composition, which is suitably in aqueous solution. The compositions may be in colloidal solution, emulsion solution, and the like.

The preferable examples for the resist pattern thickening material of the present invention include the first and the second embodiments.

The resist pattern thickening material of the first embodiment contains a resin, a crosslinking agent, and a compound having a cyclic structure, and further contains a surfactant, an organic solvent, and other components according to the purpose. The resin may have a cyclic structure at a part of itself.

The resist pattern thickening material of the second embodiment contains a crosslinking agent and a resin which has a cyclic structure at one part. The resist pattern thickening material further contains the resin, the compound having a cyclic structure, the non-ionic surfactant, the organic solvent, and the other compositions.

—Resin—

The resin is not particularly limited, and can be properly selected according to purposes. However, the preferable example includes a water-soluble resin, or an alkali-soluble resin. The more preferable examples include a resin that can cause cross-linking reaction, or a resin that can be mixed with a crosslinking agent. Those resins may be used either alone or in combination of two or more.

When the resin is a water-soluble resin, the resin preferably exhibits a water-solubility of 0.1 g or more to 25° C. water, more preferably 0.3 g or more to water, and particularly more preferably 0.5 g or more to water.

Examples of the water-soluble resins include polyvinyl alcohol, polyvinyl acetal, polyvinyl acetate, polyacrylic acid, polyvinyl pyrrolidone, polyethylene imine, polyethylene oxide, styrene-maleic acid copolymer, polyvinyl amine, polyarylamine, oxazoline group-containing water-soluble resin, water-soluble melamine resin, water-soluble urea resin, alkyd resin, sulfonamide resin, and the like.

When the resin is an alkali-soluble, the alkali-soluble resin preferably exhibits an alkali-solubility of 0.1 g or more to 25° C. 2.38% by mass tetramethylammoniumhydroxide (TMAH) aqueous solution, more preferably, the 0.3 g or more to the TMAH solution, and particularly preferably 0.5 g or more to the TMAH solution.

Examples of the alkali-soluble resin include a novolac resin, a vinylphenyl resin, polyacryl acid, polymethaacryl acid, poly p-hydroxyphenylacrylate, poly p-hydroxyphenylmethacrylate, copolymers thereof, and the like.

Of these, the polyvinyl alcohol, polyvinyl acetal and polyvinyl acetate are preferably used. In the present invention, the resin preferably contains the polyvinyl acetal, and more preferably contains 5% by mass to 40% by mass of the polyvinyl acetal because the solubility is easily changeable by crosslinking.

In the present invention, in a case of the resist pattern thickening material relating to the first embodiment, the resin may contain a cyclic structure at a part. The resist pattern thickening material relating to the second embodiment consists essentially of a resin which has the cyclic structure at a part of the resin, and may further contain the resin. Examples of the cyclic structure are not particularly limited, and are preferably selected according to the purpose. The examples may be selected from an aromatic compound, an alicyclic compound, and a heterocyclic compound.

Examples of the an aromatic compound include a multivalent phenol compound, a polyphenol compound, an aromatic polyphenol compound, an aromatic carboxylic acid compound, a perhydroxy naphthalene compound, a benzophenone compound, a flavonoid compound, a porphine, a water-soluble phenoxy resin, an aromatic-containing water-soluble pigment, derivatives and glycosides thereof, and the like. These may be used either alone or in combination of two or more.

Examples of the multivalent phenol compound include resorcin, resorcin[4]arene, pyrogallol, gallic acid, derivatives and glycosides thereof, and the like.

Examples of the polyphenol compound and derivatives thereof include catechin, anthocyanidin (pelargonidine type (4'-hydroxy), cyanidin type (3',4'-dihydroxy), delphinidin type (3',4',5'-trihydroxy), flavane-3,4-diol, proantocyanidin, derivatives and glycosides thereof, and the like.

Examples of the aromatic carboxylic acid compound and derivatives thereof include salicylic acid, phthalic acid, dihydroxybenzoic acid, tannin, derivatives and glycosides thereof, and the like.

Examples of the perhydroxy naphthalene compound and derivatives thereof include naphthalene diol, naphthalene triol, derivatives and glycosides thereof, and the like.

Examples of the benzophenone compound and derivative thereof include alizarin yellow A, derivatives and glycosides thereof, and the like.

Examples of the flavonoid compound and derivatives thereof include flavone, isoflavone, flavanol, flavonone, flavonol, flavan-3-ol, aurone, chalcone, dihydrochalcone, quercetin, derivatives or glycosides thereof, and the like.

Examples of the alicyclic compound include polycycloalkane, cycloalkane, a condensed ring, derivatives and glycosides thereof, and the like. These may be used either alone or in combination of two or more.

Example of the polycycloalkane include norbornane, adamantane, norpinane, sterane, and the like.

Examples of the cycloalkane include cyclopentane, cyclohexane, and the like.

Examples of the condensed ring include steroid, and the like.

Suitable examples of the heterocyclic compound include a nitrogen contained cyclic compound such as pyrrolidine, pyridine, imidazole, oxazole, morphorine, pyrrolidone, and the like; a oxygen contained cyclic compound such as furan, pyran, polysaccharide including, pentose, hexose, and the like.

Among the resins and the resins which has a cyclic structure at a part, a preferable resin or a resin which has a cyclic structure at part has two or more of polar groups, from the view points that the resin is excellent in at least either a water-solubility or an alkali-solubility.

Examples of the polar groups are not particularly limited, and can be selected according to purposes. Suitable examples include a hydroxy group, a cyano group, an alkoxyl group, a carboxyl group, a carbonyl group, an amino group, an amide group, an alkoxycarbonyl group, a hydroxyalkyl group, a sulfonyl group, an hydride group, a lactone group, a cyanate group, an isocyanate group, a ketone group, and the like. Of those polar groups, more suitable examples include a hydroxy group, a carboxyl group, a carbonyl group, an amino group, a sulfonyl group, and the like.

When the resin has the compound having a cyclic structure at a part, the rest of the part of the cyclic structure can be selected according to the purpose, as long as it may be either water-soluble or alkali-soluble. Examples include a water-soluble resin such as polyvinyl alcohol, polyviniylacetal, and the like; an alkali resin such as novolac resin, a vinylphenyl resin and the like.

When the resin has the cyclic structure at a part of it, a mol content of the cyclic structure is not particularly limited and can be selected from according to purpose. If the resin requires high etching resistance, the mol content is preferable 5 mol % or more, more preferably, 10 mol % or more.

The mol content can be measured by using, for example, NMR, and the like.

The content of the resin in the resist pattern thickening material may be properly determined according to the purpose. Although it varies depending on the type, the content of the crosslinking agent, the compound having a cyclic structure, and the surfactant can be selected according to the purpose.

—Crosslinking Agent—

The crosslinking agent is not particularly limited, and any one can be properly selected according to purposes. A water-soluble or an alkali-soluble crosslinking agent is preferred. Those cross-linkable by heat or acid is also preferable. Suitable examples include an amino type crosslinking agent and the like.

Suitable examples of the amino type crosslinking agent include a melamine derivative, a urea derivative, an uril derivative and the like. These may be used individually or in combination.

Examples of the urea derivative include urea, alkoxy methylene urea, N-alkoxy methylene urea, ethylene urea, ethylene urea carboxylic acid, derivatives thereof, and the like.

Examples of the melamine derivative include alkoxymethyl melamine, derivatives thereof, and the like.

Examples of the uril derivative include benzoguanamine, glycouril, derivatives thereof, and the like.

The content of the crosslinking agent in the resist pattern thickening material may be properly determined according to purposes although it varies depending on the type, content and the like, the resin which has the compound having a cyclic structure and the surfactant cannot be indiscriminately regulated.

—Compound Having a Cyclic Structure—

Examples of the compound having a cyclic structure may be either a compound or a resin. More preferably, those resins or compounds may be either water-soluble or alkali-soluble. Since the resist pattern thickening material of the present invention contains the compound having a cyclic structure, it is possible to remarkably improve the etching resistance of the resist pattern.

If the compound having a cyclic structure is water-soluble, the preferable water-solubility is 0.1 g or more to 100 g of 25° C. water, more preferably 0.3 g or more to 100 g of 25° C. water, and particularly preferably 0.5 g or more to 100 g of 25° C. water.

When the compound having a cyclic structure is alkali-soluble, the preferable alkali-solubility is 0.1 g or more to 25° C. of 2.38% TMAH solution, more preferably 0.3 g or more to 25° C. of the 2.38% TMAH solution, and particularly preferably 0.5 g or more to 25° C. of 2.38% the TMAH solution.

Examples of the compound having a cyclic structure include the aromatic compound, the alicyclic compound, the heterocyclic compound, and the like. The specific examples for those compounds are shown in the above.

Of those compounds having a cyclic structure, the compound having a cyclic structure has preferably 2 or more of polar groups, more preferably 3 or more of polar groups, and particularly preferably 4 or more of polar groups, from the viewpoint that the compound is excellent either in water-solubility or in alkali-solubility.

The polar group is not particularly limited, and any polar group can be properly selected according to purposes, including a hydroxyl group, a cyano group, an alkoxy group, a carboxyl group, a carbonyl group, an amino group, an amide group, an alkoxycarbonyl group, a hydroxyalkyl group, a sulfonyl group, a hydride group, a lactone group, a cyanate group, an isocyanate group, a ketone group, and the like. Of these, the suitable examples include a hydroxyl group, a carboxyl group, a carbonyl group, an amino group, and a sulfonyl group.

When the compound having a cyclic structure is a resin, a mol content of the compound having a cyclic structure to the resin is not particularly limited, and can be suitably selected according to the purposes. If the resin requires high etching resistance, the content is preferably 5 mol % or more, more preferably 10 mol % or more. The mol content can be measured by NMR and the like.

The content of the a compound having a cyclic structure in the resist pattern thickening material may be properly determined according to the types and the content of the resin, the crosslinking agent, the surfactant, and the like.

—Surfactant—

The surfactant can be suitably used when the affinity of the resist pattern thickening material with the resist pattern (for instance, an ArF resist pattern) to be applied to the resist pattern thickening material is insufficient. When the surfactant is contained in the resist pattern thickening material, the resist pattern can be efficiently thickened in the state excellent in in-plane uniformity to efficiently and uniformly form a fine pattern, and the foaming of the resist pattern thickening material can be also effectively suppressed.

The surfactant is not particularly limited, and any one can be properly selected according to purposes, including a non-ionic surfactant, a cationic surfactant, an anionic surfactant, an ampholytic surfactant, a silicone type surfactant and the like. These can be used either alone or in combination of two or more. Of these, the non-ionic surfactant is preferable because it has a structure containing no metal ion.

The non-ionic surfactant is not particularly limited, and can be selected according to the purposes. A specific example of the non-ionic surfactant is selected from an alkoxylate surfactant, a fatty acid ester surfactant, an amide surfactant, an alcohol surfactant, and an ethylenediamine surfactant. The specific examples of those surfactants include a polyoxyethylene-polyoxypropylene condensed compound, a polyoxyalkylene alkyl ether compound, a polyoxyethylene alkyl ether compound, a polyoxyethylene derivative compound, a sorbitan fatty acid ester compound, a glycerin fatty acid ester compound, a primary alcohol ethoxylate compound, a phenol ethoxylate compound, a nonylphenolethoxylate type, an octylphenolethoxylate type, a lauryl alcohol ethoxylate type, an oleyl alcohol ethoxylate type, a fatty acid type, an amide type, a natural alcohol type, an ethylenediamine type, a secondary alcoholethoxylate type, and the like.

The cationic surfactant is not particularly limited, and can be selected according to the purposes. The examples include an alkylcationic surfactant, an amide type quaternary cationic surfactant, ester type quaternary cationic surfactant, and the like.

The ampholytic surfactant is not particularly limited and can be selected according to the purposes. The examples include an amine oxide surfactant, a betaine surfactant, and the like.

The content of the surfactant in the resist pattern thickening material may be properly determined according to purposes, although it varies depending on the type, content, and the like of the above resin, crosslinking agent, compound having a cyclic structure and the like and cannot be indiscriminately regulated.

—Organic Solvent—

The organic solvent can improve the solubility of the above resin, crosslinking agent, the compound having a cyclic structure, and the resin which has the cyclic structure at a part in the resist pattern thickening material by being included in the resist pattern thickening material.

The organic solvent is not particularly limited, and any one can be properly selected according to purposes, including an alcoholic organic solvent, a chain ester organic solvent, a cyclic ester organic solvent, a ketone organic solvent, a chain ether organic solvent, a cyclic ether organic solvent and the like.

Examples of the alcoholic organic solvent include methanol, ethanol, propyl alcohol, isopropyl alcohol, butyl alcohol, and the like.

Examples of the chain ester organic solvent include ethyl lactate, propylene glycol methyl ether acetate (PGMEA), etc.

Examples of the cyclic ester organic solvent include a lactone type such as γ-butyrolactone, etc.

Examples of the ketone organic solvent include a ketone type such as acetone, cyclohexanone, heptanone, etc.

Examples of the chain ether organic solvent include ethylene glycol dimethyl ether, etc.

Examples of the cyclic ether include tetrahydrofuran, dioxane, etc.

These organic solvents may be used individually or in combination. Of these, a one having a boiling point of about 80° C. to 200° C. is preferably used because the thickening can be finely performed.

The content of the organic solvent in the resist pattern thickening material may be properly determined according to purposes although it is varied depending on the kind, content and the like of the above resin, crosslinking agent, the compound having a cyclic structure, and surfactant and cannot be indiscriminately regulated.

—Other Components—

Other components are not particularly limited as long as they do not impair the effect of the present invention, and any one can be properly selected according to purposes, including known additives of all types. The suitable examples include a thermal acid generator, a quencher represented by amine type, amide type, ammonium salt, and the like.

The content of the other components in the resist pattern thickening material may be properly determined according to purposes although it is varied depending on the kind, content and the like of the above resin, crosslinking agent, the compound having a cyclic structure, surfactant, organic solvent and the like and cannot be indiscriminately regulated.

—Use or the Like—

The resist pattern thickening material of the present invention can be used by applying onto the resist pattern.

During applying, the surfactant may be separately applied prior to the application of the resist pattern thickening material without being included in the resist pattern thickening material.

When the resist pattern thickening material is applied onto the resist pattern to be thickened, the resist pattern is thickened and thus the resist pattern is formed.

The pattern thus formed by thickening resist pattern has a shorter diameter of a hole pattern and a shorter pitch of a line & space resist pattern than those of the patterns formed by the aforementioned resist patterns. Applying the resist pattern thickening material allows a pattern to form a finer pattern, exceeding the exposure limit of an exposure device used for patterning the resist pattern. For example, when an ArF excimer laser is used, an obtained resist pattern is thickened by the resist pattern thickening material of the present invention, and then a resist pattern is formed. In doing so, a pattern formed by the resist pattern has as fine pattern as the one patterned by an electron beam.

Thickened parts of the resist pattern can be controlled to a desired range, according to a viscosity, a thickness of the applied material, a baking temperature, a baking time, and the like of the resist pattern thickening material.

—Material for Resist Pattern (Resist Pattern to be Thickened)—

The material for the resist pattern (resist pattern to be thickened) is not particularly limited, and any one can be properly selected from known resist materials according to purposes, which may be of negative type and positive type, including a chemically amplified resist material represented by a g-line resist, an I-line resist, a KrF resist, an ArF resist, an F2 resist, an electron beam resist, and the like, all of which can be patterned by g-line, I-line, a KrF excimer laser, an ArF excimer laser, an F2 excimer laser, an electron beam, and the like. Those may be either a chemical amplification type or a non-chemical amplification type. Of these, a KrF resist, an ArF resist, and the like are preferred. An ArF resist is more preferred.

Examples of the resist pattern material include a novolac resist, a PHS resist, an acryl resist, a cycloolefin-maleic anhydride (COMA type) resist, a cycloolefin resist, a hybrid (alicyclic acrylate-COMA copolymer) resist, and the like. Those resists may be fluorine-modified.

The forming process, size, thickness and the like of the resist pattern are not particularly limited, and any one can be properly selected according to purposes. Particularly, the thickness is generally set to about 0.2 μm to 200 μm although it can be properly determined depending on the underlying layer to be worked, etching conditions and the like.

The thickening of the resist pattern to be thickened using the resist pattern thickening material of the present invention is described below in reference to the drawings.

Figure 1B:
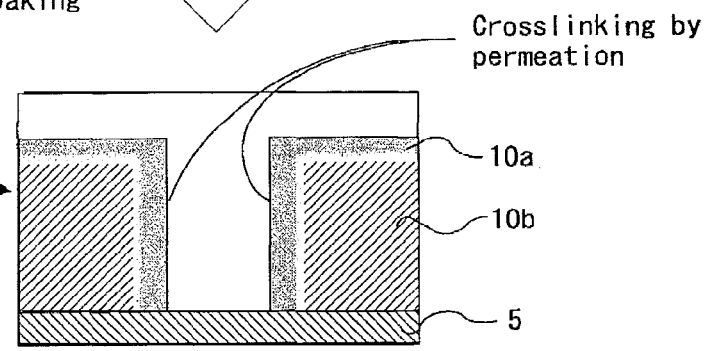

As shown in FIG. 1A, a resist pattern (resist pattern to be thickened) 3 is formed on a substrate (base material) 5, and a resist pattern thickening material 1 is then applied to the surface of the resist pattern (the resist pattern to be thickened) 3 and pre-baked (heated and dried) to form a film. The mixing (penetration) of the resist pattern thickening material 1 into the resist pattern to be thickened 3 then occurs near the interface between the resist pattern to be thickened 3 and the resist pattern thickening material 1. The mixing (penetration) part is crosslinked, hence a mixing layer comprising the resist pattern to be thickened 3 and the resist pattern thickening material 1. As shown in FIG. 1B, a resist pattern comprises a surface layer 10*a*, which is the mixing layer, on a resist pattern to be thickened 10*b* (resist pattern to be thickened 3).

Figure 1C:
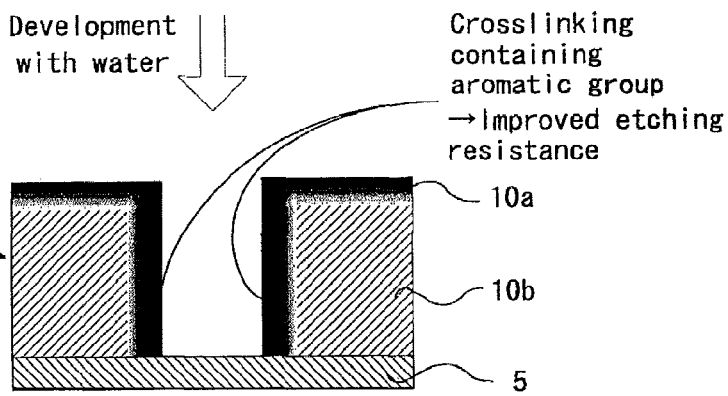

Thereafter, a developing processing is performed as shown in FIG. 1C, whereby the part which is not mixed with the resist pattern to be thickened 3 of the applied resist pattern thickening material 1 is dissolved and removed to form (develop) a resist pattern 10.

The step for developing may be water development or a development with alkali developer.

The resist pattern 10 comprises a surface layer 10*a* formed by mixing (penetrating) and crosslinking the resist pattern thickening material 1 on the surface of a resist pattern to be thickened 10*b*. Since the resist pattern 10 is thickened to the extent of thickness portion of the surface layer 10*a*, compared with the resist pattern (resist pattern to be thickened) 3, the pitch of the pattern formed by the resist pattern 10 is shorter than that of the pattern formed by the resist pattern 3, and the pattern formed by the resist pattern 10 is fine. This allows for forming a finer pattern exceeding an exposure limit of an optical source of an exposure device. A pattern formed by the resist pattern 10 is finer than a pattern formed by the resist pattern 3.

The surface layer 10*a* in the resist pattern 10 is formed of the resist pattern thickening material 1 which comprises either the compound having a cyclic structure or the resin which has the cyclic structure at a part, hence the resist pattern thickening material 1 is remarkably excellent in etching resistance. Therefore, even if the resist pattern to be thickened 3 is formed of a material inferior in etching resistance, the resist pattern 10 having the surface layer 10*a* excellent in etching resistance on the surface is thus remarkably excellent in etching resistance.

—Use—

The resist pattern thickening material of the present invention can be suitably used for thickening a resist pattern, and fining a pattern, exceeding an exposure limit. The resist pattern thickening material can be further suitably used for the thickening of the resist pattern to be thickened, and particularly suitably used for the resist pattern and forming process thereof of the present invention and the semiconductor device and manufacturing process thereof of the present invention.

The resist pattern thickening material of the present invention contains either the compound having a cyclic structure or the resin which has the cyclic structure at a part. Therefore, the resist pattern thickening material is suitable for plasma, and the like, is also suitable for applying and thickening a pattern formed of a resin that requires an improvement of etching resistance of a surface. The resist pattern thickening material can be more suitably used especially when the material for the resist pattern to be thickened does not include the compound having a cyclic structure or the resin which has the cyclic structure at a part.

(Resist Pattern)

The resist pattern of the present invention comprises a surface layer on a resist pattern to be thickened.

The surface layer is preferably excellent in etching resistance, and its etching rate (nm/s) is preferably small, compared with the resist pattern to be thickened. Concretely, the ratio (resist pattern/surface layer) in etching rate (nm/s) of the resist pattern to be thickened to the surface layer is preferably 1.1 more preferably 1.2 or more, and particularly preferably 1.3 or more.

The etching rate (nm/s) can be measured, for example, by performing an etching processing for a prescribed time by use of a known etching device to measure the film reducing amount of a sample and calculating the film reducing amount per unit time.

The surface layer preferably contains the compound having a cyclic structure or the resin which has a cyclic structure at least at a part, and can be suitably formed by use of the resist pattern thickening material of the present invention.

Whether or not the surface layer contains the compound having a cyclic structure or the resin which has a cyclic structure at least at a part can be confirmed, for example, by analyzing the IR or UV absorption spectrum for this surface layer.

The resist pattern may contain at least one of the compound having a cyclic structure and the resin which has a cyclic structure at least at a part. This embodiment is also preferred from the viewpoint of converting a resist pattern to be thickened.

The resist pattern of the present invention may have a structure having a clear boundary between the resist pattern to be thickened and the surface layer or an unclear boundary. In the former structure, the content of the compound having a cyclic structure and the resin which has a cyclic structure at least at a part is generally discontinuously reduced from the surface layer to the inner part, and in the latter structure, the content of the compound having a cyclic structure and the resin which has a cyclic structure at least at a part is generally gradually reduced from the surface layer to the inner part.

The resist pattern of the present invention can be suitably manufactured according to the process for forming the resist pattern of the present invention described below.

The resist pattern of the present invention can be suitably used for a functional part such as mask pattern, reticle pattern, magnetic head, LCD (liquid crystal display), PDP (plasma display panel), SAW filter (surface acoustic wave filter), and the like; an optical part used for connection of optical wiring; a micro part such as micro actuator, and the like; a semiconductor device and the like, and suitably used for the semiconductor device of the present invention described later.

(Process for Forming a Resist Pattern)

The process for forming the resist pattern of the present invention comprises a step for applying a resist pattern thickening material so as to cover a surface of a resist pattern to be thickened after formation of the resist pattern to be thickened.

The materials for the resist pattern to be thickened include those described above for the resist pattern thickening material of the present invention. One of the preferable examples is an ArF resist.

The resist pattern to be thickened can be formed according to a known process.

The resist pattern to be thickened can be formed of an underlying layer (base material). The underlying layer (base material) is not particularly limited, and any one can be properly selected according to purposes. When the resist pattern to be thickened is ordinarily formed on a semiconductor device, the examples of substrate include silicon, various oxide films, and the like.

The application process for the resist pattern thickening material is not particularly limited, and any process can be properly selected from known application processes according to purposes, suitably including spin coating and the like. The condition for the spin coating, for example, the cycle is set to about 100 rpm to 10000 rpm, preferably 800 rpm to 5000 rpm, and the coating time is set to about 1 second to 10 minutes, preferably 1 second to 90 seconds.

The thickness of the applied material during the application is ordinarily around 10 nm to 1000 nm (100 Å to 10000 Å), more preferably 50 nm to 500 nm (500 Å to 5000 Å).

In applying, the surfactant may be separately applied prior to the application of the resist pattern thickening material without being included in the resist pattern thickening material.

The applied resist pattern thickening material is preferably pre-baked (heated and dried) in or after the application because the mixing (penetration) of the resist pattern thickening material into the resist pattern to be thickened can be efficiently caused in the interface between the resist pattern to be thickened and the resist pattern thickening material.

The condition, process and the like of the pre-baking (heating and drying) are not particularly limited as long as a resist pattern is not softened, and any one can be properly selected according to purposes. For example, the temperature is set to about 40° C. to 120° C., preferably 70° C. to 100° C., and the time is set to about 10 seconds to 5 minutes, preferably 40 seconds to 100 seconds.

The crosslinking baking (crosslinking reaction) of the applied resist pattern thickening material is preferably performed after the pre-baking (heating and drying) because the crosslinking reaction of the mixed (penetrated) part can be efficiently progressed in the interface between the resist pattern to be thickened and the resist pattern thickening material.

The condition, process and the like of the crosslinking baking (crosslinking reaction) are not particularly limited, and any one can be properly selected according to purposes. Generally, a temperature condition higher than the pre-baking (heating and drying) is adapted. For the condition of the crosslinking baking (crosslinking reaction), for example, the temperature is set to about 70° C. to 150° C., preferably 90° C. to 130° C., and the time is set to about 10 seconds to 5 minutes, preferably 40 seconds to 100 seconds.

The step for developing the applied resist pattern thickening material is preferably performed after the crosslinking baking (crosslinking reaction). In this case, the part not crosslinked with the resist pattern to be thickened and the part weakly crosslinked (mixed) therewith (highly water-soluble part) of the applied resist pattern thickening material can be dissolved and removed to develop (to obtain) the resist pattern of the present invention manufactured in the thickened state.

The step for developing is the same as described above.

The process for forming the resist pattern of the present invention is then described below in reference to the drawings.

Figure 2A:
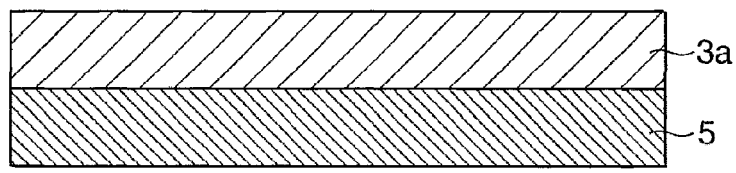
FIGS. 2A through 2E are schematic views for showing one example of a process for forming a resist pattern according to the present invention.
Figure 2B:
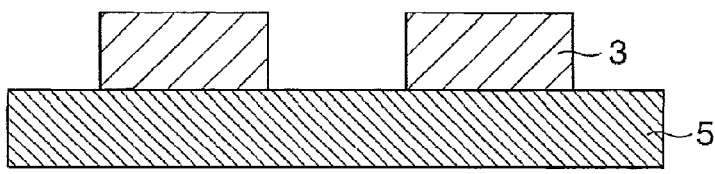
Figure 2C:
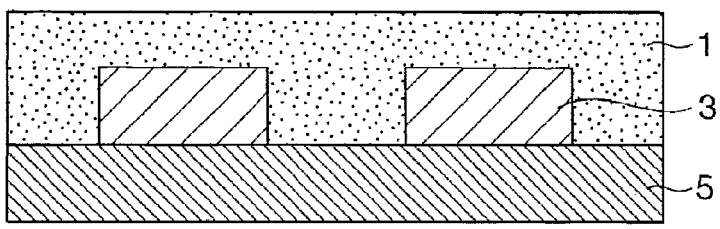

A resist material 3a is applied onto a substrate (base material) 5 as shown in FIG. 2A and then patterned as shown in FIG. 2B to form a resist pattern (resist pattern to be thickened) 3. A resist pattern thickening material 1 is applied onto the surface of the resist pattern to be thickened 3, and pre-baked (heated and dried) to form a paint film. The mixing (penetration) of the resist pattern thickening material 1 into the resist pattern (resist pattern to be thickened) 3 occurs in the interface between the resist pattern (resist pattern to be thickened) 3 and the resist pattern thickening material 1.

Figure 2D:
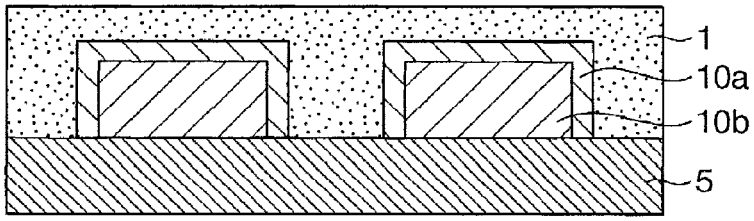
Figure 2E:
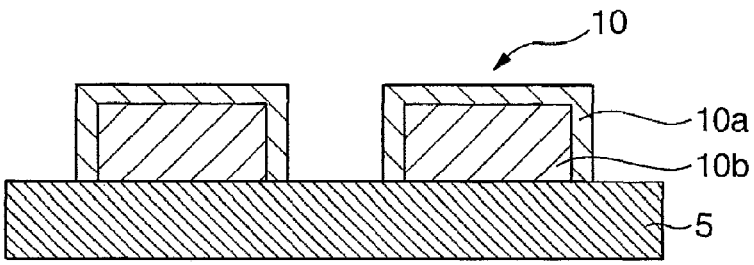

When a crosslinking baking (crosslinking reaction) is preformed at a temperature higher than in the pre-baking (heating and drying) as shown in FIG. 2D, the mixed (penetrated) layer is crosslinked in the interface between the resist pattern to be thickened 3 and the resist pattern thickening material 1. Thereafter, a step for developing is performed as shown in FIG. 2E, whereby the part not mixed with the resist pattern (resist pattern to be thickened) 3 and the part weakly crosslinked therewith (highly water-soluble part) of the applied resist pattern thickening material 1 is dissolved and removed to form (develop) a resist pattern 10 having a surface layer 10a on a resist pattern to be thickened 10b (the resist pattern to be thickened 3).

The step for developing may be water development or a development with an alkali aqueous solution. The water development is preferable because the step for developing can be efficiently performed at a low cost.

The resist pattern 10 comprises the surface layer 10a formed by mixing the resist pattern thickening material 1 onto the resist pattern to be thickened 3 on the surface of the resist pattern to be thickened 10b (the resist pattern to be thickened 3). Since the resist pattern 10 is thickened by the thickness portion of the surface layer 10a, compared with the resist pattern to be thickened 3 (resist pattern 10b), the pitch of the pattern formed by the resist pattern 10 is smaller than that of the pattern formed by the resist pattern to be thickened 3 (the interlayer resist pattern 10b), and a pattern formed by the resist pattern 10 is fine.

The surface layer 10a in the resist pattern 10 is formed of the resist pattern thickening material 1. The resist pattern thickening material 1 is excellent in etching resistance since it contains one of the compound having a cyclic structure and the resin which has the cyclic structure. Therefore, even if the resist pattern to be thickened 3 (interlayer resist pattern 10b) is formed of a material inferior in etching material, the resist pattern 10 having the surface layer 10a excellent in etching resistance can be formed.

The resist pattern 10 may have a either clear or unclear border between the interlayer resist pattern 10b and the surface layer 10a.

The resist pattern formed according to the process for forming the resist pattern of the present invention is the resist pattern of the present invention. This resist pattern comprises the surface layer formed by mixing the resist pattern thickening material of the present invention onto the resist pattern to be thickened on the surface of the resist pattern to be thickened. Therefore, even if the resist pattern to be thickened is formed of a material inferior in etching resistance, the resist pattern having the surface layer excellent in etching resistance on the surface of the resist pattern to be thickened can be efficiently formed according to the forming process for a resist pattern of the present invention, because the resist pattern thickening material contains at least one of the compound having a cyclic structure and the resin which has the cyclic structure at a part. The resist pattern formed according to the forming process for resist pattern of the present invention is thickened by the thickness portion of the surface layer, compared with the resist pattern to be thickened, the pitch of the pattern formed by the manufactured resist pattern is smaller than that of the pattern formed by the resist pattern to be thickened prior to thickening. According to the forming process for a resist pattern of the present invention, a fine pattern can be thus efficiently manufactured.

The resist pattern formed according to the forming process for a resist pattern of the present invention can be suitably used for a functional part such as mask pattern, reticle pattern, magnetic head, LCD (liquid crystal display), PDP (plasma display panel), SAW filter (surface acoustic wave filter), and the like; an optical part used for connection of wiring by light; a micro part such as micro actuator, etc.; a semiconductor device; and the like, and also suitably used for the semiconductor device and the process for manufacturing the same of the present invention described below.

(Semiconductor Device and Process for Manufacturing a Semiconductor Device)

The semiconductor device of the present invention is not particularly limited except having a pattern formed of the above-described resist pattern of the present invention, and comprises known members properly selected according to purposes.

Concrete examples of the semiconductor device of the present invention suitably include flash memory, DRAM, FRAM and the like.

The semiconductor device of the present invention can be suitably manufactured according the process for manufacturing a semiconductor device of the present invention described below.

The process for manufacturing a semiconductor device of the present invention comprises a step for forming a resist pattern to be thickened and a step for patterning, and further comprises other processes properly selected as occasion demands.

The step for forming a resist pattern comprises a step for forming a resist pattern by applying a resist pattern thickening material to cover a surface of a resist pattern to be thickened to thicken the resist pattern to be thickened to form the resist pattern, after forming the resist pattern to be thickened on a substrate (underlying layer). Examples of the substrate (the underlying layers) include surface layers for all kinds of members in semiconductor devices, and a substrate such as silicon wafer and surface layer thereof are suitably used. The resist pattern to be thickened is the same as described above. The application process is also the same as described above. After the application, the above-mentioned pre-baking, crosslinking baking and the like are preferably performed.

The step for patterning comprises patterning the substrate (underlying layer) by performing an etching using the resist pattern (as a mask pattern) formed in the step for forming the resist pattern.

The etching process is not particularly limited, and any process can be properly selected from known processes according to purposes, suitably including dry etching and the like. The condition of the etching is not particularly limited, and any one can be properly selected according to purposes.

Suitable examples of the other processes include a step for applying surfactant, a step for developing and the like.

The step for applying surfactant comprises applying the surfactant to the surface of the resist pattern to be thickened prior to the step for forming a resist pattern.

The surfactant can be selected according to the purpose. The examples include those same as described above, and more suitably, a polyoxyethylene-polyoxypropylene condensed compound, a polyoxyalkylene alkyl ether compound, a polyoxyethylene alkyl ether compound, a polyoxyethylene derivative compound, a sorbitan fatty acid ester compound, a glycerin fatty acid ester compound, a primary alcohol ethoxylate compound, a phenol ethoxylate compound, nonylphenolethoxylate type, an octylphenolethoxylate type, a lauryl alcohol ethoxylate type, an oleyl alcohol ethoxylate type, a fatty acid ester type, an amide type, a natural alcohol type, an ethylenediamine type, a secondary alcohol ethoxylate type, an alkylcationic type, an amide type quaternary cationic type, an ester type quaternary cationic type, an amine oxide type, a betaine type, and the like.

The step for developing comprises performing the step for developing of the applied resist pattern thickening material prior to the step for patterning after the step for forming a resist pattern. The step for developing is the same as described above.

According to the process for manufacturing a semiconductor device of the present invention, for example, semiconductor devices of all sorts including flash memory, DRAM, FRAM and the like can be efficiently manufactured.

EXAMPLE

Examples of the present invention are more concretely described below, but the present invention is never limited by these examples.

Example 1

Preparation of Resist Pattern Thickening Material

Resist pattern thickening materials 1A-1J according to the present invention having compositions shown in Table 1 were prepared. In Table 1, the unit of the numeric in parentheses represents a part by mass. In the column of "Resin", "KW3" represents a polyvinyl acetal resin (manufactured by SEKISUI CHEMICAL Co., Ltd.), and "PVA" shows a polyvinyl alcohol resin (manufactured by KURARAY Co., Ltd, Poval 117). In the column of "Crosslinking agent", "Uril" represents tetramethoxymethyl glycoluril, "Urea" represents N,N'-dimethoxymethyl dimethoxyethyleneurea, and "Melamine" represents hexamethoxymethylmelamine. In the column of "Surfactant", "TN-80" represents a non-ionic surfactant (manufactured by ASAHI DENKA Co., Ltd., a primary alcohol ethoxylate type surfactant), "PC-6" represents a non-ionic surfactant (ASAHI DENKA Co., Ltd., a special phenol ethoxylate type surfactant), "PC-8" represents a non-ionic surfactant (ASAHI DENKA Co., Ltd., a special phenol ethoxylate type surfactant), "PC-12" represents a non-ionic surfactant (ASAHI DENKA Co., Ltd., a special phenol ethoxylate type surfactant). As the main solvent component except the above resins, crosslinking agents, and compounds which contains a circular structure, a mixture of pure water (deionized water) and isopropyl alcohol (mass ratio of pure water (deionized water) to isopropyl alcohol=98.6:0.4) was used.

TABLE 1

| | Resin | Crosslinking agent | Compound having a cyclic structure | Surfactant |
| --- | --- | --- | --- | --- |
| 1A | KW-3(16) | Uril (1.16) | Catechin (5) | None |
| 1B | KW-3(16) | Urea (1.16) | Catechin (5) | None |
| 1C | KW-3(16) PVA(3) | Melamine (0.8) | Catechin (5) | None |
| 1D | KW-3(16) | Uril (1.16) | Catechin (5) | TN-80(0.25) |
| 1E | KW-3(16) | Urea (1.16) | Catechin (5) | PC-8(0.25) |
| 1F | KW-3(16) PVA(3) | Melamine (0.8) | Catechin (5) | PC-12(0.25) |
| 1G | KW-3(16) | Uril (1.16) | Delphinidin (5) | None |
| 1H | KW-3(16) | Uril (1.16) | Resorcin(5) | TN-80(0.25) |
| 1I | KW-3(16) | Urea (1.16) | 1,3-naphthalene diol (5) | PC-8(0.25) |
| 1J | KW-3(16) | Uril (1.16) | 4-hydroxyadamantane-2-carboxylic acid (0.8) | PC-6(0.25) |

—Resist Pattern and Manufacture Thereof—

Each of the thus-prepared resist pattern thickening materials 1A-1J were applied to a hole pattern formed by the ArF resist (manufactured by SUMITOMO CHEMICAL Co., Ltd., PAR700 an alicyclic resist) by spin coating first in a condition of 1000 rpm/5 s and then in a condition of 3500 rpm/40 s, and subjected to pre-baking in a condition of 85° C./70 s and further to crosslinking baking in a condition of 110° C./70 s. The resulting resist pattern thickening materials 1A-1J were then rinsed with pure water (deionized water) for 60 sec to remove the non-crosslinked part, and the resist patterns thickened by the resist pattern thickening materials 1A-1J were developed, whereby the resist patterns were formed.

The sizes of the hole patterns formed by the resist patterns (the sizes of the hole patterns formed by the resist patterns after thickening the resist patterns) were shown in Table 2 as well as the initial pattern sizes (the sizes of the hole patterns formed by the resist patterns to be thickened). In Table 2, "1A"-"1J" correspond to the resist pattern thickening materials 1A-1J, respectively.

TABLE 2

|     | Initial pattern size (nm) | Pattern size after thickening (nm) |
| --- | --- | --- |
| 1A  | 200.5 | 175.2 |
| 1B  | 203.3 | 181.2 |
| 1C  | 199.8 | 180.0 |
| 1D  | 205.7 | 154.4 |
| 1E  | 202.6 | 171.7 |
| 1F  | 203.9 | 160.3 |
| 1G  | 198.8 | 171.1 |
| 1H  | 201.1 | 148.7 |
| 1I  | 200.8 | 165.6 |
| 1J  | 202.6 | 178.6 |

Each of the thus-prepared resist pattern thickening materials 1A-1J were applied to a line & space pattern formed by the ArF resist (manufactured by SUMITOMO CHEMICAL Co., Ltd., PAR700) by spin coating first in a condition of 1000 rpm/5 s and then in a condition of 3500 rpm/40 s, and subjected to pre-baking in a condition of 85° C./70 s and further to crosslinking baking in a condition of 110° C./70 s. The resulting resist pattern thickening materials 1A-1J were then rinsed with pure water (deionized water) for 60 sec to remove the non-crosslinked part, and the resist patterns thickened by the resist pattern thickening materials 1A-1J were developed, whereby the respective resist patterns were formed.

The sizes of the space patterns formed by the resist patterns (the sizes of the space patterns formed by the resist patterns after thickening the resist patterns) were shown in Table 3 as well as the initial pattern the sizes (the sizes of the space pattern formed by the resist patterns to be thickened). In Table 3, "1A"-"1J" correspond to the resist pattern thickening materials 1A-1J, respectively.

TABLE 3

|     | Initial pattern space size (nm) | Pattern space size after thickening (nm) |
| --- | --- | --- |
| 1A  | 165.2 | 135.2 |
| 1B  | 162.3 | 143.8 |
| 1C  | 159.8 | 137.7 |
| 1D  | 155.7 | 116.9 |
| 1E  | 158.5 | 128.8 |
| 1F  | 160.2 | 123.0 |
| 1G  | 163.4 | 125.4 |
| 1H  | 160.0 | 121.1 |
| 1I  | 158.0 | 120.5 |
| 1J  | 163.8 | 138.1 |

It is apparent from the results of Tables 2 and 3 that the resist pattern thickening material of the present invention is applicable to both a hole pattern and a line & space pattern to thicken them. The resist pattern thickening material of the present invention can make the inside diameter of the hole pattern narrow and fine when used for the formation of the hole pattern, make the width of a linear pattern (the space between resist patterns forming the linear pattern) small and fine when used for the formation of the linear pattern, and increase the area of an isolated pattern when used for the formation of the isolated pattern.

The resist pattern thickening materials 1D, 1H, 1I and 1J of the present invention were applied and crosslinked onto the surface of a resist formed on a silicon substrate to form surface layers 0.5 μm thick thereon, respectively. These surface layers and the KrF resist (manufactured by SHIPLEY, UV-6) and a polymethyl methacrylate (PMMA) for comparison were etched for 3 minutes by use of an etching machine (Parallel-plate type RIE device, manufactured by FUJITSU LIMITED) under conditions of Pμ=200 W, pressure=0.02 Torr, $CF_4$ gas=100 sccm, and the film reduction amounts of samples were measured to calculate the etching rates, which were then relatively evaluated on the basis of the etching rate of the KrF resist.

TABLE 4

| Material name | Etching rate (nm/s) | Rate ratio |
| --- | --- | --- |
| UV-6 | 62.7 (627 Å/s) | 1.00 |
| PMMA | 770 (77.0 Å/s) | 1.23 |
| 1D | 600 (60.0 Å/s) | 0.96 |
| 1H | 610 (61.0 Å/s) | 0.97 |
| 1I | 590 (59.0 Å/s) | 0.94 |
| 1J | 575 (57.5 Å/s) | 0.92 |

It is apparent from the result of Table 4 that the etching resistances of the resist pattern thickening materials of the present invention are close to the KrF resist and more remarkably excellent than the PMMA.

When the resist pattern thickening materials 1A-1J were applied onto the resist pattern to be thickened on a wafer substrate allowed to stand out of a clean room for 1 month after exposure, the similar pattern thickening effect as in the immediate application after exposure can be obtained.

It is supposed from this result that the resist pattern thickening material of the present invention thickens the resist pattern to be thickened not by using a crosslinking reaction by diffusion of acid as the prior art called RELACS, but depending on the compatibility with the resist pattern to be thickened.

Example 2

Preparation of Resist Pattern Thickening Material

Resist pattern thickening materials 2A-2M according to the present invention having compositions shown in Table 5 were prepared. In Table 5, the unit of the numeric in parentheses represents a part by mass. In the column of "Resin", "Resin 1", "Resin 2" and "Resin 3" are synthesized as shown hereinafter. In the column of "Crosslinking agent," "Uril" represents tetramethoxymethyl glycoluril, "Urea" represents N,N'-dimethoxymethyl dimethoxyethyleneurea, and "Melamine" represents hexamethoxymethylmelamine. In the column of "Surfactant", "TN-80" represents a non-ionic surfactant (manufactured by ASAHI DENKA Co., Ltd., a primary alcohol ethoxylate type surfactant). As the main solvent component except the above resins, crosslinking agents, and surfactant agents and a mixture of pure water (deionized water) and isopropyl alcohol (mass ratio of pure water (deionized water) to isopropyl alcohol=16:0.75) was used. "Resin 1" is a Polyvinyl β-resorcin acetal resin synthesized as shown hereinafter. Namely, 10 g of PVA 500 (manufactured by KANTO KAGAKU) was dissolved in 100 g of deionized water, 0.8 g of concentrated hydrochloride was added in the deionized water, and then the deionized water was stirred at the temperature of 40° C. for three hours. 2.36 g of β-resorcin aldehyde (manufactured by TOKYO KASEI KOGYO Co., Ltd.) was further added to the deionized water, and the deionized water was then stirred at the temperature of 40° C. for six hours. After the temperature of the reacted solution was decreased to room temperature, 15 mass % of THAM (tetramethylammoniumhydroxide) was added to the deionized water to neutralize. The reacted solution was dripped into 2 L ethanol to separate the resins from the reacted solution. The resins were filtered with a glass filter and were dried at 45° C. under reduced pressure in vacuum baking oven for six hours. After repeating this process three times, an aimed polyvinyl β-resorcin acetal resin was synthesized. The yield was 6.8 g. The ratio of acetalization by NMR was 20.6 mol %.

"Resin 2" is "Polyvinyl-2,3-dihydroxybenz acetal resin" synthesized as shown hereinafter. Namely, 3,4-dihydroxybenz acetal resin was synthesized by the same processes of "Resin 1" except replacing β-resorcin aldehyde with 2,3-dihydroxybenz aldehyde. The yield was 6.6 g. The ratio of acetalization by NMR was 20.1 mol %.

"Resin 3" is "polyvinyl β-resorcin acetal resin" synthesized as shown hereinafter. Namely, 10 g of polyvinyl alcohol 500 (manufactured by KANTO KAGAKU) was dissolved in 100 g of deionized water, 0.4 g of concentrated hydrochloride was added in the deionized water, and then the deionized water was stirred at the temperature of 40° C. for three hours. 0.5 g of β-resorcin aldehyde (manufactured by TOKYO KASEI KOGYO Co., Ltd.) was added to the deionized water, and the deionized water was then stirred at the temperature of 40° C. for six hours. The temperature of the reacted solution was decreased to ambient temperature, 15 mass % of THAM (tetramethyllead ammonium hydro oxide) was added to the deionized water to neutralize. The reacted solution was dripped into 2 L ethanol to separate the resins from the reacted solution. The resins were filtered with a glass filter and were then dried under reduced pressure in a vacuum baking oven of 45° C. for six hours. After repeating this process three times, an aimed polyvinyl β-resorcin acetal resin was synthesized. The yield was 4.1 g. The ratio of acetalization by NMR was 3.7 mol %.

TABLE 5

| Lubricating material name | Resin | Crosslinking agent | Surfactant agent |
|---|---|---|---|
| 2A | Resin 1 (1) | Uril (0.5) | None |
| 2B | Resin 1 (1) | Urea (0.5) | None |
| 2C | Resin 1 (1) | Melamine (0.25) | None |
| 2D | Resin 1 (1) | Uril (0.5) | TN-80(0.0025) |
| 2E | Resin 1 (1) | Urea (0.5) | TN-80(0.0025) |
| 2F | Resin 1 (1) | Melamine (0.25) | TN-80(0.0025) |
| 2G | Resin 2 (1) | Uril (0.5) | None |
| 2H | Resin 2 (1) | Urea (0.5) | None |
| 2I | Resin 2 (1) | Melamine (0.25) | None |
| 2J | Resin 2 (1) | Uril (0.5) | TN-80(0.0025) |
| 2K | Resin 2 (1) | Urea (0.5) | TN-80(0.0025) |
| 2L | Resin 2 (1) | Melamine (0.25) | TN-80(0.0025) |
| 2M | Resin 3 (1) | Uril (0.5) | None |

—Resist Pattern and Manufacture Thereof—

Each of the thus-prepared resist pattern thickening materials 2A to 2L were applied to a hole pattern formed of the ArF resist (manufactured by SUMITOMO CHEMICAL Co., Ltd., PAR700 an alicyclic resist) by spin coating first in a condition of 1000 rpm/5 s and then in a condition of 3500 rpm/40 s, and subjected to pre-baking in a condition of 85° C./70 s and further to crosslinking baking in a condition of 110° C./70 s. The resulting resist pattern thickening materials 2A to 2L were then rinsed with pure water (deionized water) for 60 seconds to remove the non-crosslinked part, and the resist patterns thickened by the resist pattern thickening materials 2A to 2L were developed, whereby the resist patterns were formed.

The sizes of the patterns formed by the formed resist patterns (resist patterns) were shown in Table 6 as well as the initial pattern sizes (the sizes of the hole patterns before thickening the resist patterns). In Table 6, "2A" to "2L" correspond to the resist pattern thickening materials 2A to 2L, respectively.

TABLE 6

| Lubricating material name | Initial pattern size (nm) | Pattern size after lubricating (nm) |
|---|---|---|
| 2A | 201.5 | 194.2 |
| 2B | 203.1 | 197.4 |
| 2C | 199.8 | 190.9 |
| 2D | 205.1 | 191.8 |
| 2E | 195.6 | 187.4 |
| 2F | 196.9 | 170.3 |
| 2G | 198.0 | 190.0 |
| 2H | 201.0 | 194.8 |
| 2I | 200.6 | 189.6 |
| 2J | 199.8 | 184.6 |
| 2K | 204.1 | 191.0 |
| 2L | 200.8 | 173.9 |

Each of the thus-prepared resist pattern thickening materials 2A-2L were applied onto a line & space pattern formed of the ArF resist (manufactured by SUMITOMO CHEMICAL Co., Ltd., PAR700 an alicyclic resist) by spin coating first in a condition of 1000 rpm/5 s and then in a condition of 3500 rpm/40 s, and were subjected to pre-baking in a condition of 85° C./70 s and further to crosslinking baking in a condition of 110° C./70 s. The resulting resist pattern thickening materials 2A-2L were then rinsed with pure water (deionized water) for 60 seconds to remove the non-crosslinked part, and the resist patterns thickened by the resist pattern thickening materials 2A-2L were developed, whereby the respective resist patterns were formed.

The sizes of the patterns formed by the resist patterns were shown in Table 7 as well as the initial pattern sizes (the sizes of the line & space patterns before thickening the resist patterns). In Table 7, "2A"-"2L" correspond to the resist pattern thickening materials 2A-2L, respectively.

TABLE 7

| Lubricating material name | Initial pattern space size (nm) | Pattern space size after lubricating (nm) |
|---|---|---|
| 2A | 160.2 | 147.2 |
| 2B | 158.8 | 148.5 |
| 2C | 159.6 | 147.2 |
| 2D | 157.7 | 128.6 |
| 2E | 160.5 | 139.8 |
| 2F | 161.2 | 129.4 |
| 2G | 160.4 | 140.1 |
| 2H | 163.0 | 145.2 |
| 2I | 156.8 | 136.5 |
| 2J | 162.1 | 129.4 |
| 2K | 161.8 | 131.8 |
| 2L | 155.6 | 123.9 |

It is apparent from the results of Tables 6 and 7 that the resist pattern thickening material of the present invention is applicable to both a hole pattern and a line & space pattern to thicken them. The resist pattern thickening material of the present invention can make the inside diameter of the hole pattern narrow and fine when used for the formation of the hole pattern, make the pitch of a linear pattern (the space between resist patterns forming the linear pattern) small and fine when used for the formation of the linear pattern, and increase the area of an isolated pattern when used for the formation of the isolated pattern.

The resist pattern thickening materials 2A, 2G and 2M of the present invention were applied and crosslinked onto the surface of a resist formed on a silicon substrate to form surface layers 0.5 μm thick thereon, respectively. These surface layers and the KrF resist (manufactured by SHIPLEY, UV-6) and a polymethyl methacrylate (PMMA) for comparison were etched for 3 minutes by use of an etching machine (Parallel-plate type RIE device, manufactured by FUJITSU LIMITED) under conditions of Pμ=200 W, pressure=0.02 Torr, $CF_4$ gas=100 sccm, and the film reduction amounts of samples were measured to calculate the etching rates, which were then relatively evaluated on the basis of the etching rate of the KrF resist.

TABLE 8

| Material name | Etching rate (nm/s) | Rate ratio |
| --- | --- | --- |
| UV-6 | 63.3 (633 Å/s) | 1.00 |
| PMMA | 78.1 (781 Å/s) | 1.23 |
| 2A | 59.5 (595 Å/s) | 0.94 |
| 2G | 60.0 (600 Å/s) | 0.95 |
| 2M | 80.5 (805 Å/s) | 1.27 |

It is apparent from the result of Table 8 that the etching resistance of the resist pattern thickening materials of the present invention is close to the KrF resist and more remarkably excellent than the PMMA.

The arylacetal content of the resist pattern thickening material 2M is less than 5 mol %. The etching resistances for the resist pattern thickening material 2M is slightly inferior to those of the resist pattern thickening materials 2A and G, both of which has an arylacetal content of 5 mol % or more.

When the resist pattern thickening materials 2A-2M were applied onto the resist pattern to be thickened on a wafer substrate allowed to stand out of a clean room for 1 month after exposure, the same pattern thickening effect as in the immediate application of the resist pattern thickening material after exposure can be obtained.

It is assumed from this result that the resist pattern thickening material of the present invention thickens the resist pattern not by use of a crosslinking reaction by diffusion of acid as the conventional technique called RELACS, but depending on the compatibility with the resist pattern.

Example 3

Flash Memory and its Manufacture

Example 3 is one embodiment of the semiconductor device and manufacturing process thereof of the present invention using the resist pattern thickening material of the present invention. In Example 3, resist films 26, 27, 29, 32 and 34 are thickened by use of the resist pattern thickening material of the present invention according to the same process as in Examples 1 and 2.

Figure 3A:
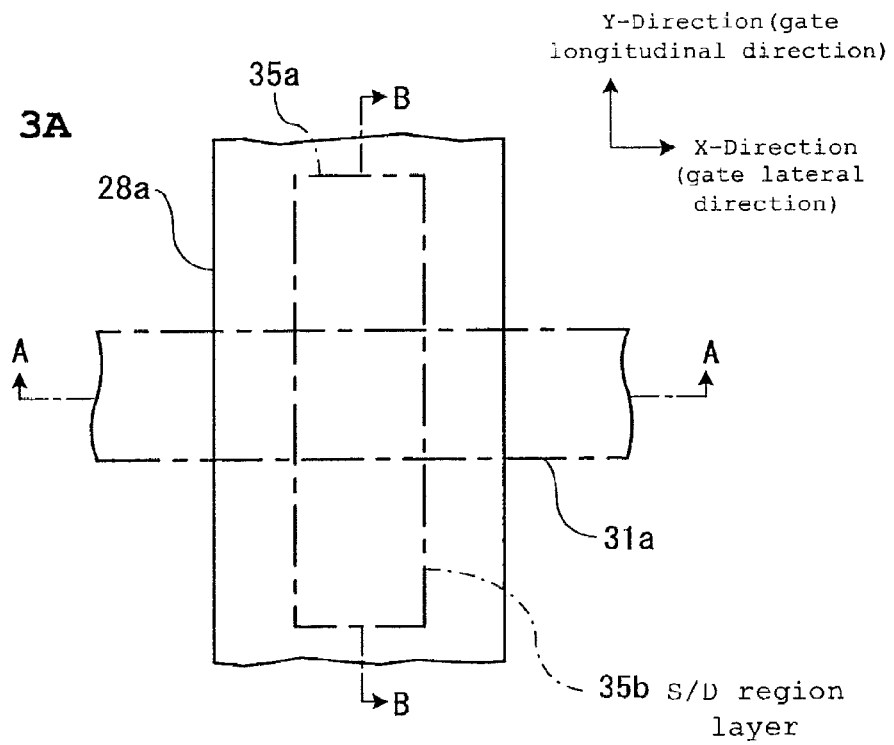
FIGS. 3A and 3B are upper surface views of a FLASH EPROM that is one example of a semiconductor device according to the present invention.
Figure 3B:
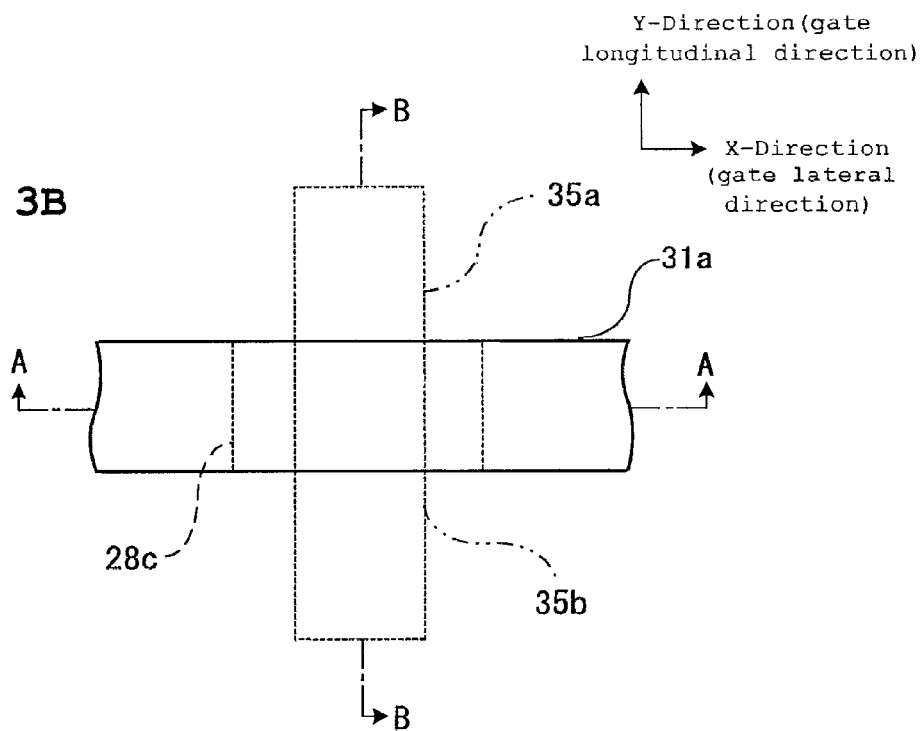

FIGS. 3A and 3B are upper surface views (plan views) of a FLASH EPROM called FLOTOX type or ETOX type. FIGS. 4A to 4C, FIGS. 5D to 5F, and FIGS. 6G to 6I are schematic sectional views for showing one example for the manufacturing process for the FLASH EPROM, wherein the left views in FIGS. 4A through 6I are schematic sectional (A-directional sectional) views in the gate lateral direction (X-direction in FIGS. 3A and 3B) of the part for forming a MOS transistor having a floating gate electrode in a memory cell pat (first element region), the central views are schematic sectional (B-directional sectional) views in the gate longitudinal direction (Y-direction in FIGS. 3A and 3B) orthogonal to the X-direction in the memory cell part of the same part as in the left views, and the right views are schematic sectional (A-directional sectional in FIGS. 3A and 3B) views of the part for forming a MOS transistor in a peripheral circuit part (second element region).

A field oxide film 23 by $SiO_2$ film was selectively formed on the element separating region on a p-type Si substrate 22 as shown in FIG. 4A. Thereafter, a first gate insulation film 24a in the MOS transistor of the memory cell part (first element region) was formed with $SiO_2$ film by thermal oxidation so as to have a thickness of 10 nm to 30 nm (100 Å to 300 Å), and a second gate insulation film 24b in the MOS transistor of the peripheral circuit part (second element region) was also formed with $SiO_2$ film by thermal oxidation so as to have a thickness of 10 nm to 50 nm (100 Å to 500 Å) in another process. When the first gate insulation film 24a and the second gate insulation film 24b are formed in the same thickness, the oxide films may be formed simultaneously in the same process.

In order to form the MOS transistor having a n-depression type channel in the memory cell part (the left and central views in FIG. 4A), the peripheral circuit part (the right view in FIG. 4A) was masked with a resist film 26 for the purpose of controlling threshold voltage. To the region for forming a channel region just under the floating gate electrode, phosphor (P) or arsenic (As) was introduced as n-type impurity in a dose of $1\times10^{11}$-$1\times10^{14}$ cm$^{-2}$ by ion implantation to form a first threshold control layer 25a. The dose and conductive type of the impurity can be properly selected depending on selection of depression type or accumulation type.

In order to form the MOS transistor having a n-depression type channel in the peripheral circuit part (the right view of FIG. 4B), the memory cell part (the left and central views in FIG. 4B) was masked with a resist film 27 for the purpose of controlling the threshold voltage. To the region for forming a channel region just under the gate electrode, phosphor (P) or arsenic (As) was introduced as n-type impurity in a dose of $1\times10^{11}$-$1\times10^{14}$ cm$^{-2}$ by ion implantation to form a second threshold control layer 25b.

A first polysilicon film (first conductor film) 28, 50 nm to 200 nm (500 Å to 2000 Å)-thick, was formed on the whole surface as the floating gate electrode of the MOS transistor of the memory cell part (the left and central views in FIG. 4C) and the gate electrode of the MOS transistor of the peripheral circuit part (the right view in FIG. 4C).

The first polysilicon film 28 was patterned with a resist film 29 formed as a mask, as shown in FIG. 5D, to form a floating gate electrode 28a in the MOS transistor of the memory cell part (the left and central views in FIG. 5D). At this time, the patterning was performed in X-direction so as to have a final dimension width, as shown in FIG. 5D, but not in Y-direction to leave the region for forming a S/D region layer as covered with the resist film 29.

After the resist film 29 was removed as shown in the left and central views in FIG. 5E, a capacitor insulation film 30a comprising $SiO_2$ film was formed in a thickness of about 20 nm to 50 nm (200 Å to 500 Å) by thermal oxidation so as to cover the floating gate electrode 28a. At this time, a capacitor insulating film 30b comprising $SiO_2$ film is also formed on the first polysilicon film 28 of the peripheral circuit part (the right view in FIG. 5E). The capacitor insulation films 30a and 30b, which were formed of only SiO$_2$ films herein, may be formed of a composite film comprising SiO$_2$ film and Si$_3$N$_4$ film laminated in 2-3 layers.

A second polysilicon film (second conductor film) 31 forming a control gate electrode was formed in a thickness of 50 nm to 200 nm (500 Å to 2000 Å), as shown in FIG. 5E, so as to cover the floating gate electrode 28a and the capacitor insulation film 30a.

The memory cell part (the left and central views in FIG. 5F) was masked with a resist film 32 as shown in FIG. 5F, and the second polysilicon film 31 and capacitor insulation film 30b of the peripheral circuit part (the right view in FIG. 5F) were successively removed by etching to expose the first polysilicon film 28.

The second polysilicon film 31, capacitor insulation film 30a and first polysilicon film 28a patterned only in X-direction of the memory cell part (the left and central views in FIG. 6G) were patterned in Y-direction with the resist film 32 as a mask so as to have the final dimension of a first gate part 33a as shown in FIG. 6G), whereby a lamination by a control gate electrode 31a/a capacitor insulation film 30c/a floating gate electrode 28c about 1 µm in width was formed in Y-direction. The first polysilicon film 28 of the peripheral circuit part (the right view in FIG. 6G) was also patterned with the resist film 32 as a mask so as to have the final dimension of a second gate part 33b, whereby a gate electrode 28b about 1 µm in width was formed.

By use of the lamination by the control gate electrode 31a/the capacitor insulation film 30c/the floating gate electrode 28c of the memory cell part (the left and central views in FIG. 6H) as mask, phosphor (P) or arsenic (As) was introduced to the Si substrate 22 in the element forming region in a dose of $1 \times 10^{14}$-$1 \times 10^{16}$ cm$^{-2}$ by ion plantation to form n-type S/D region layers 35a and 35b. Further, by use of the gate electrode 28b of the peripheral circuit part (the right view in FIG. 6H) as mask, phosphor (P) or arsenic (As) was introduced as n-type impurity in a dose of $1 \times 10^{14}$-$1 \times 10^{16}$ cm$^{-2}$ to the Si substrate 22 in the element forming region to form S/D region layers 36a and 36b.

An innerlayer insulation film 37 by PSG film was formed in a thickness of about 500 nm (5000 Å) so as to cover the first gate part 33a of the memory cell part (the left and central views in FIG. 6I) and the second gate part 33b of the peripheral circuit part (the right view in FIG. 6I).

Thereafter, contact holes 38a and 38b and contact holes 39a and 39b were formed in the innerlayer insulating film 37 formed on the S/D region layers 35a and 35b and the S/D region layers 36a and 36b, and S/D electrodes 40a and 40b and S/D electrodes 41a and 41b were then formed.

According to the above, a FLASH EPROM was manufactured as semiconductor device as shown in FIG. 6I.

In this FLASH EPROM, since the second gate insulating film 24b of the peripheral circuit part (the right views in FIGS. 4A through 5F) are always covered with the first polysilicon film 28 or gate electrode 28b after the formation (the right views in FIGS. 4C to 5F), the second gate insulating film 24b keeps the originally formed thickness. Therefore, the thickness control of the second gate insulating film 24b can be facilitated, and the adjustment of conductive impurity concentration for the control of threshold voltage can be also facilitated.

In the above example, the patterning for the formation of the first gate part 33a is performed with a prescribed width first in the gate lateral direction (X-direction in FIGS. 3A and 3B) and then in the gate longitudinal direction (Y-direction in FIGS. 3A and 3B) to form a final prescribed width, but the patterning may be reversely performed with the prescribed width first in the gate longitudinal direction (Y-direction in FIGS. 3A and 3B) and then in the gate lateral direction (X-direction in FIGS. 3A and 3B) to form the final prescribed width.

The example of manufacture of FLASH EPROM shown in FIGS. 7A through 7C is the same as the above example except changing the following process after the process shown in FIG. 5F in the above embodiment as shown in FIGS. 7A through 7C. Namely, the different point from the above example is that a high melting point metallic membrane (fourth conductor film) 42 comprising tungsten (W) film or titanium (Ti) film was formed in a thickness of about 200 nm (2000 Å) on the second polysilicon film 31 of the memory cell part (the left and central views in FIG. 7A) and the first polysilicon film 28 of the peripheral circuit part (the right view in FIG. 7A to provide a polycide film. The processes after FIG. 7A or the processes shown in FIGS. 7B through 7C were performed in the same manner as in FIGS. 6G through 6I. The description for the same process as FIGS. 6G through 6I was omitted, and the same part as in FIGS. 6G through 6I was shown by the same reference mark in FIGS. 7A through 7C.

According to the above, a FLASH EPROM was manufactured as semiconductor device as shown in FIG. 7C.

In this FLASH EPROM, since the high melting point metallic membranes (fourth conductor films) 42a and 42b are provided on the control gate electrode 31a and the gate electrode 28b, the electric resistance can be further reduced.

As the high melting point metallic membrane (fourth conductor film), a high melting point metal silicide membrane such as titanium silicide (TiSi) membrane, etc. may be used in addition to the above-mentioned high melting point metallic membranes (fourth conductor films) 42a and 42b.

The example of manufacturing FLASH EPROM shown in FIGS. 7A through 7C is the same as the above example except constituting the second gate part 33c of the peripheral circuit part (second element region) (the right view in FIG. 8A) to have a structure comprising a first polysilicon film 28b (first conductor film)/a SiO$_2$ film 30d (capacitor insulation film)/a second polysilicon film 31b (second conductor film) similarly to the first gate part 33a of the memory cell part (first element region) (the left and central views in FIG. 8A), and short-circuiting the first polysilicon film 28b and the second polysilicon film 31b to form a gate electrode as shown in FIG. 8B or FIG. 8C.

As shown in FIG. 8B, an opening part 52a extending through the first polysilicon film 28b (first conductor film)/the SiO$_2$ film 30d (capacitor insulation film)/the second polysilicon film 31b (the second conductor film) is formed, for example, in a position different from the second gate part 33c shown in FIG. 8A, e.g., on an insulation film 54, and a third conductor film, for example, a high melting point metallic membrane 53a such as W film, Ti film, etc. is buried in the opening part 52a, whereby the first polysilicon film 28b and the second polysilicon film 31b are short-circuited. As shown in FIG. 8C, an opening part 52b extending through the first polysilicon film 28b (first conductor film)/the SiO$_2$ film 30d (capacitor insulation film) is formed to expose the first polysilicon film 28b of the lower layer to the bottom of the opening part 52b, and a third conductor film, for example, a high melting point metallic membrane 53b such as W film, Ti film, etc. is buried in the opening part 52b, whereby the first polysilicon film 28b and the second polysilicon film 31b are short-circuited.

In this FLASH EPROM, since the second gate part 33c of the peripheral circuit part has the same structure as the first gate part 33a of the memory cell part, the peripheral circuit part can be formed simultaneously with the formation of the memory cell part to effectively simplify the manufacturing process.

The third conductor film 53a or 53b and the high melting point metallic membrane (fourth conductor film) 42 may be simultaneously formed as a common high melting point metallic membrane in addition to the above independent formation.

Example 4

Manufacture of Magnetic Head

Example 4 relates to the manufacture of a magnetic head as an applied example of the resist pattern according to the present invention using the resist pattern thickening material according to the present invention. In Example 4, resist patterns 102 and 126 are thickened by the same process as in Example 1 and 2 by use of the resist pattern thickening material according to the present invention.

FIGS. 9A through 9D are flowcharts for showing the manufacture of the magnetic head.

Figure 9A:
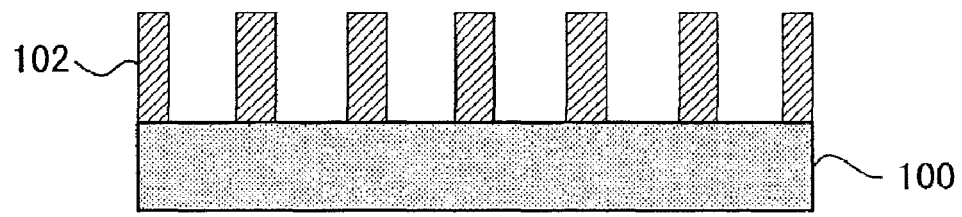
FIGS. 9A through 9D are schematic sectional views for showing one example of the application of a resist pattern thickened by use of the resist pattern thickening material of the present invention to manufacture of a magnetic head.

A resist film was formed on an innerlayer insulation layer 100 in a thickness of 6 μm, as shown in FIG. 9A, followed by exposure and development to form a resist pattern to be thickened 102 having an opening pattern for forming a spiral thin film magnetic coil.

Figure 9B:
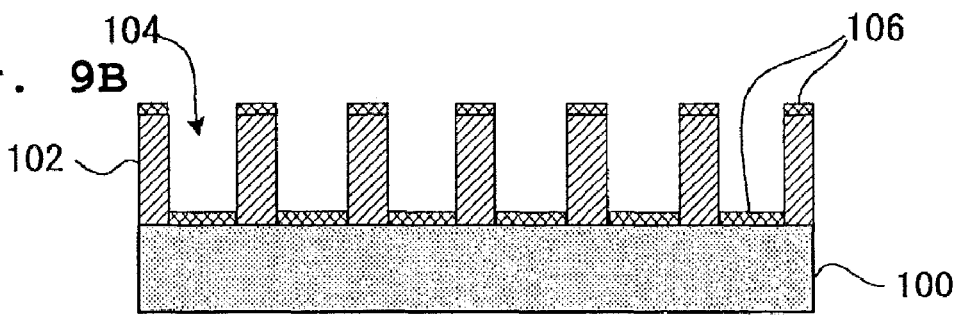

A plating underlying layer 106 comprising the lamination of a Ti adhesion layer 0.01 μm thick and a Cu adhesion layer 0.05 μm thick was formed by evaporation, as shown in FIG. 9B, on the resist pattern to be thickened 102 and the part having no resist pattern to be thickened 102 formed thereon or the exposed surface of the opening part 104 on the innerlayer insulation layer 100.

Figure 9C:
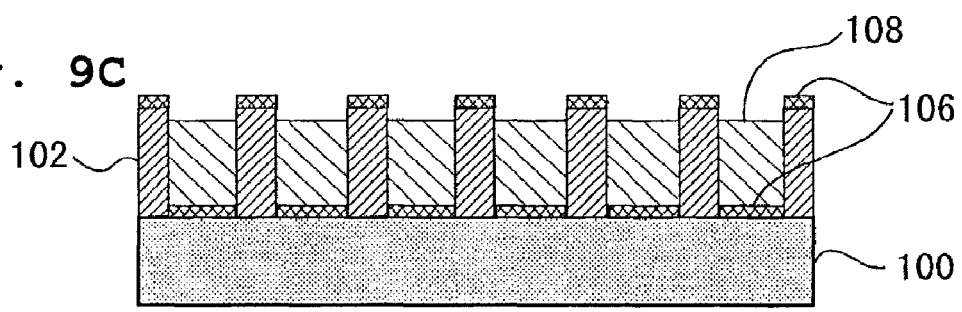

A thin film conductor 108 comprising a Cu plating film 3 μm thick was formed, as shown in FIG. 9C, in the part having no resist pattern to be thickened 102 formed thereon, or on the surface of the plating underlying layer 106 formed on the exposed surface of the opening part 104 on the innerlayer insulation layer 100.

Figure 9D:
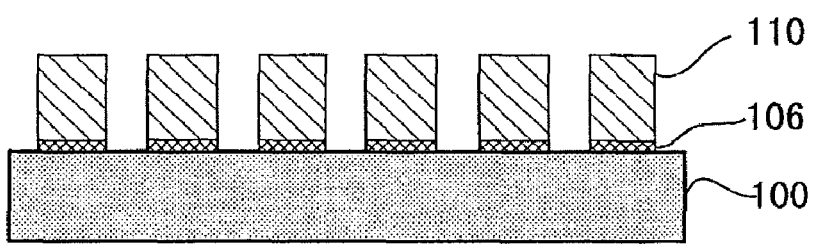

When the resist pattern to be thickened 102 is dissolved and removed and lifted off from the innerlayer insulation layer 100 as shown in FIG. 9D, a thin film magnetic coil 110 by the spiral pattern of the thin film conductor 108 is formed.

According to the above, the magnetic head was manufactured.

In the resulting magnetic head, since a spiral pattern is finely formed by the resist pattern to be thickened 102 thickened by use of the thickening material according to the present invention, the thin film magnetic coil 110 is fine and fine, and also excellent in mass-productivity.

FIGS. 10 through 15 are flowcharts for showing the manufacture of another magnetic head.

Figure 10:
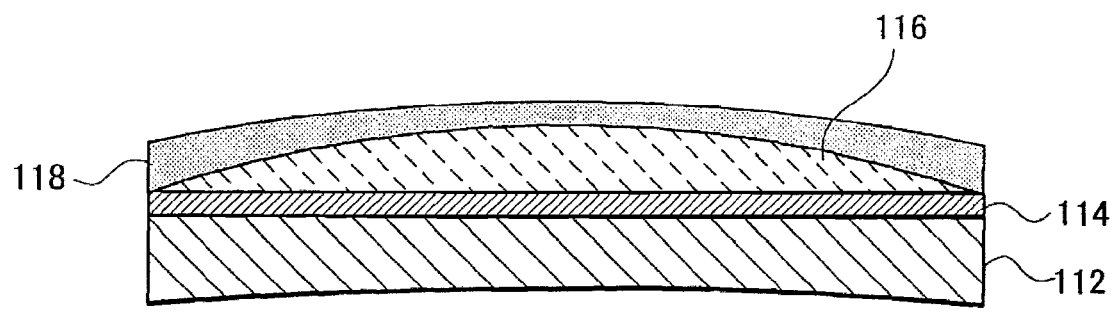
FIG. 10 is a schematic sectional view for showing a process (1) of one example of the application of the resist pattern thickened by use of the resist pattern thickening material of the present invention to manufacture of a magnetic head.

A gap layer 114 was formed on a ceramic nonmagnetic substrate 112 by sputtering as shown in FIG. 10. An insulator layer by silicon oxide and a conductive underlying layer comprising Ni—Fe permalloyperm alloy, which are not shown, are preliminarily formed on the nonmagnetic substrate 112 by sputtering, and a lower magnetic layer comprising Ni—Fe permalloyperm alloy is further formed thereon. A resin insulation film 116 was formed by use of a thermosetting resin in a prescribed region on the gap layer 114 except the part forming the magnetic tip of the lower magnetic layer not shown. A resist material was then applied to the resin insulation film 116 to form a resist film 118.

Figure 11:
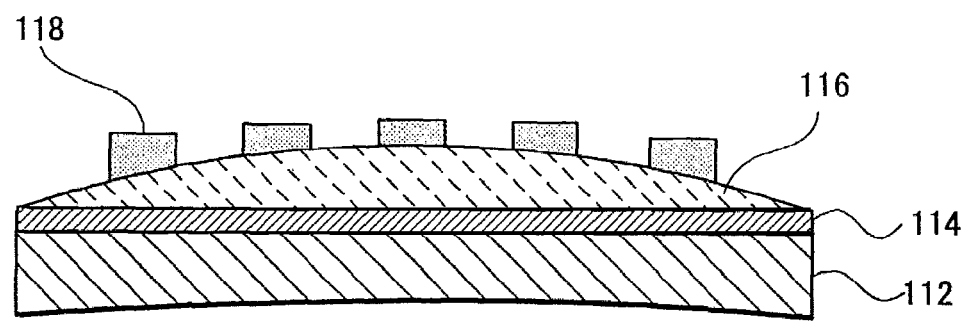
FIG. 11 is a schematic sectional view for showing a process (2) of one example of the application of the resist pattern thickened by use of the resist pattern thickening material of the present invention to manufacture of a magnetic head.
Figure 12:
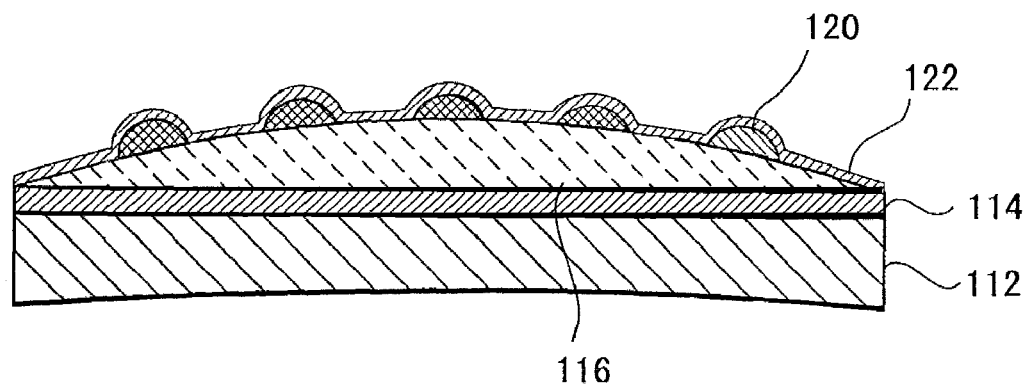
FIG. 12 is a schematic sectional view for showing a process (3) of one example of the application of the resist pattern thickened by use of the resist pattern thickening material of the present invention to manufacture of a magnetic head.

The resist film 118 was then subjected to exposure and development, as shown in FIG. 11, to form a spiral pattern. The resist film 118 of the spiral pattern was thermally set at several hundreds° C. for about 1 hr as shown in FIG. 12 to form a projection-like first spiral pattern 120. A conductive underlying layer 122 comprising Cu was further formed on the surface thereof so as to cover it.

Figure 13:
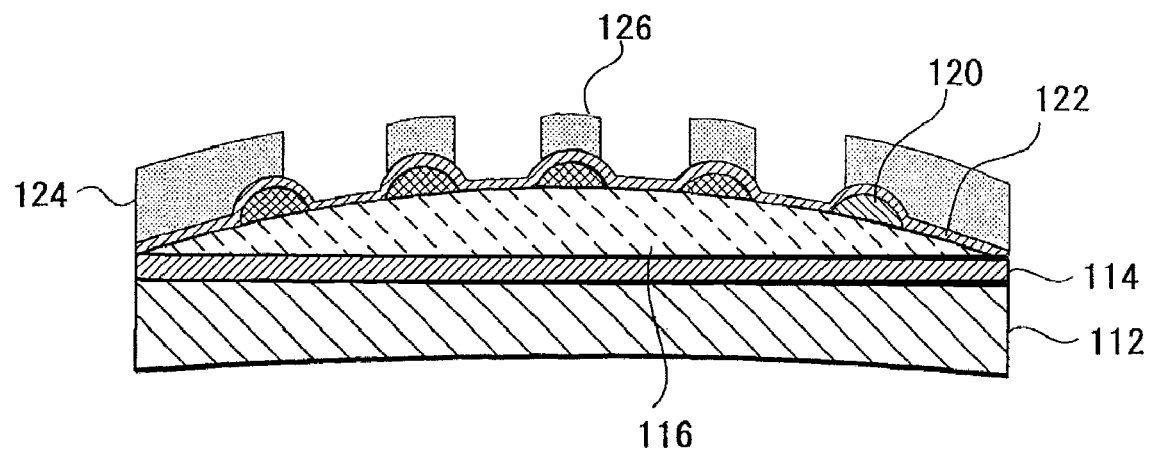
FIG. 13 is a schematic sectional view for showing a process (4) of another example of the application of the resist pattern thickened by use of the resist pattern thickening material of the present invention to manufacture of a magnetic head.

A resist material was applied onto the conductive underlying layer 122 by spin coating to form a resist film 124, as shown in FIG. 13, and the resist film 124 was patterned on the first spiral pattern 120 to form a resist pattern 126.

Figure 14:
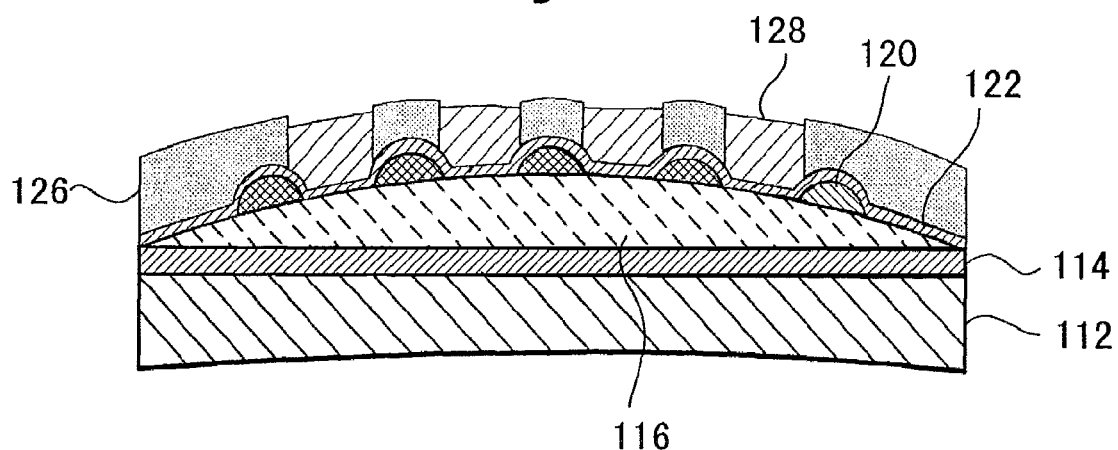
FIG. 14 is a schematic sectional view for showing a process (5) of another example of the application of the resist pattern thickened by use of the resist pattern thickening material of the present invention to manufacture of a magnetic head.
Figure 15:
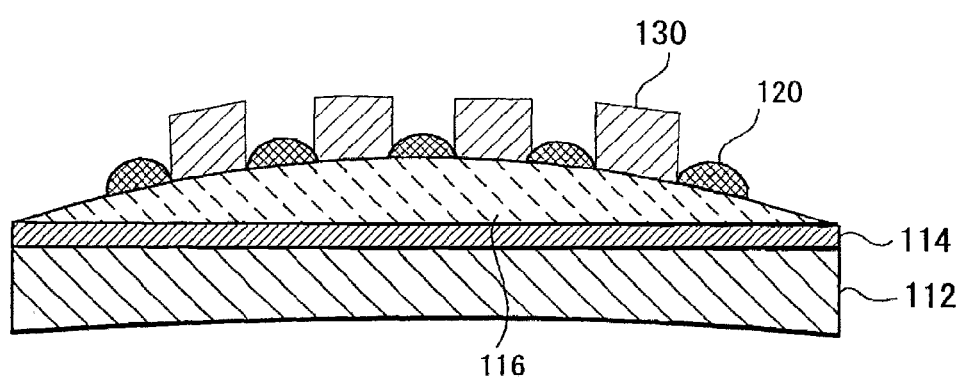
FIG. 15 is a schematic sectional view for showing a process (6) of another example of the application of the resist pattern thickened by use of the resist pattern thickening material of the present invention to manufacture of a magnetic head.

A Cu conductor layer 128 is formed by plating, as shown in FIG. 14, on the exposed surface of the conductive underlying layer 122, or on the part having no resist pattern 126 formed thereon. Thereafter, the resist pattern 126 was lifted off, as shown in FIG. 15, from the conductive underlying layer 122 by being dissolved and removed to form a spiral thin film magnetic coil 130 by the Cu conductor layer 128.

Figure 16:
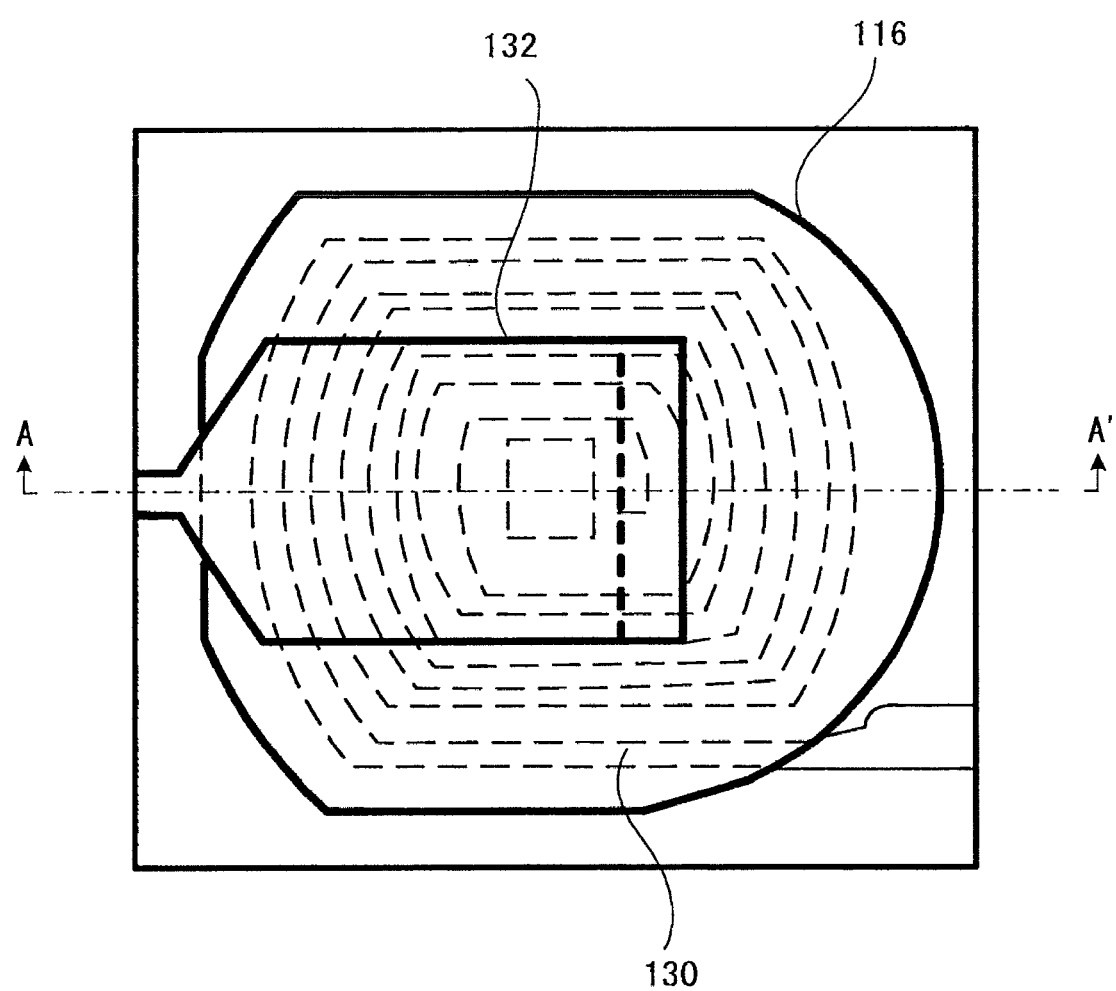
FIG. 16 is a plan view showing one example of the magnetic head manufactured in the processes of FIGS. 10 to 15

According to the above, a magnetic head having the magnetic layer 132 on the resin insulation film 116 and the thin film magnetic coil 130 on the surface, as shown in the plan view of FIG. 16, was manufactured.

In the resulting magnetic head, since a spiral pattern is finely formed by the resist pattern 126 thickened by use of the thickening material according to the present invention formed thereon, the thin film magnetic coil 130 is fine and fine, and also excellent in mass-productivity.

According to the present invention, it is possible to provide a resist pattern thickening material useful for forming a fine pattern with low cost by applying the resist pattern thickening material, exceeding an exposure limit for an optical resource of an exposure device, improving the etching resistance of the resist pattern.

Further, according to the present inventions, it is possible to provide a resist pattern which can be patterned by using ArF excimer laser, has a fine structure, and is excellent in etching resistance.

According to the present invention, it is also possible to provide a process for forming a resist pattern capable of using ArF excimer laser light as exposure light with excellent mass-productivity and forming a fine pattern by resist pattern over the exposure limit of light with low cost, with ease, and with improving etching resistance.

According to the present invention, it is possible to provide a high-performance semiconductor device having a fine pattern formed by a resist pattern.

According to the present invention, it is possible to provide a high-performance semiconductor device having a fine pattern formed by a resist pattern.

Further more, according to the present invention, it is possible to use the ArF excimer laser light as an exposure light and is also possible to provide an efficient and mass productive process for manufacturing a high-performance semiconductor device having a fine pattern.

What is claimed is:

1. A process for manufacturing a semiconductor device comprising:
   forming a resist pattern by applying a resist pattern thickening material to cover a surface of a resist pattern to be thickened to thicken the resist pattern to be thickened to form the resist pattern, after forming the resist pattern to be thickened on an underlying layer; and
   patterning the underlying layer by performing an etching using the resist pattern formed in forming the resist pattern which is thickened as a mask, wherein the resist pattern thickening material comprises a resin, a cross-linking agent, and a compound having a cyclic structure which is selected from an aromatic compound, an alicyclic compound, and a heterocyclic compound; and pure water, wherein the aromatic compound is selected from a polyphenol compound, a naphthalene polyvalent alcohol compound, a benzophenone compound, a flavonoid compound, and derivatives and glycosides thereof, the alicyclic compound is selected from polycycloalkane, cycloalkane, steroids, derivatives and glycosides thereof, and the heterocyclic compound is selected from pyrrolidine, pyridine, imidazole, morpholine, furan, pyran, and saccharides.

2. A process for manufacturing a semiconductor device according to claim 1, wherein the resist pattern is formed of an ArF resist.

3. A process for manufacturing a semiconductor device according to claim 2, wherein the ArF resist is one type selected at least from an acryl resist having a side-chain of an alicyclic group, a cycloolefin-maleic acid anhydride resist, and a cycloolefin resist.

4. A process for manufacturing a semiconductor device according to claim 1, further comprising:

applying a non-ionic surfactant to the surface of the resist pattern to be thickened prior to forming the resist pattern;

wherein the non-ionic surfactant is one selected at least from a polyoxyethylene-polyoxypropylene condensed compound, a polyoxyalkylene alkyl ether compound, a polyoxyethylene alkyl ether compound, a polyoxyethylene derivative compound, a sorbitan fatty acid ester compound, a glycerin fatty acid ester compound, a primary alcohol ethoxylate compound, and a phenol ethoxylate compound.

* * * * *